(12) United States Patent  (10) Patent No.: US 8,830,740 B2
Sasago et al.  (45) Date of Patent: Sep. 9, 2014

(54) SEMICONDUCTOR STORAGE DEVICE

(75) Inventors: Yoshitaka Sasago, Tachikawa (JP);
Hiroyuki Minemura, Kokubunji (JP);
Takashi Kobayashi, Higashimurayama (JP); Toshimichi Shintani, Kodaira (JP);
Satoru Hanzawa, Hachioji (JP);
Masaharu Kinoshita, Tsukuba (JP)

(73) Assignee: Hitachi, Ltd., Tokyo (JP)

( * ) Notice: Subject to any disclaimer, the term of this patent is extended or adjusted under 35 U.S.C. 154(b) by 28 days.

(21) Appl. No.: 13/814,104

(22) PCT Filed: Aug. 26, 2011

(86) PCT No.: PCT/JP2011/004751
§ 371 (c)(1),
(2), (4) Date: Feb. 4, 2013

(87) PCT Pub. No.: WO2012/032730
PCT Pub. Date: Mar. 15, 2012

(65) Prior Publication Data
US 2013/0141968 A1  Jun. 6, 2013

(30) Foreign Application Priority Data
Sep. 8, 2010 (JP) ................................. 2010-200447

(51) Int. Cl.
*G11C 11/00* (2006.01)
*H01L 47/00* (2006.01)
*G11C 13/00* (2006.01)

(52) U.S. Cl.
CPC ........ *G11C 13/0004* (2013.01); *G11C 2213/71* (2013.01); *G11C 2213/72* (2013.01)

USPC ......... 365/163; 365/148; 257/2; 257/E47.001

(58) Field of Classification Search
CPC ............. G11C 13/004; G11C 2213/71; G11C 2213/72
USPC ......................................................... 365/163
See application file for complete search history.

(56) References Cited

U.S. PATENT DOCUMENTS

| 8,254,160 B2 * | 8/2012 | Murooka et al. ............... 365/148 |
| 2004/0174732 A1 | 9/2004 | Morimoto |
| 2005/0201182 A1 | 9/2005 | Osada et al. |
| 2006/0250863 A1 | 11/2006 | Nakai et al. |
| 2008/0149913 A1 | 6/2008 | Tanaka et al. |
| 2008/0239799 A1 | 10/2008 | Watanabe |
| 2010/0182828 A1 | 7/2010 | Shima et al. |

(Continued)

FOREIGN PATENT DOCUMENTS

| JP | 2004-272975 A | 9/2004 |
| JP | 2005-260014 A | 9/2005 |

(Continued)

*Primary Examiner* — Son Mai
(74) *Attorney, Agent, or Firm* — Miles & Stockbridge P.C.

(57) ABSTRACT

The purpose of the present invention is to improve a rewriting transmission rate and reliability of a phase change memory. To attain the purpose, a plurality of phase change memory cells (SMC or USMC) which are provided in series between a word line (2) and a bit line (3) and have a selection element and a storage element that are parallel connected with each other are entirely set, and after that, a part of the cells corresponding to a data pattern is reset. Alternatively, the reverse of the operation is carried out.

15 Claims, 27 Drawing Sheets

(56) References Cited

U.S. PATENT DOCUMENTS

| | | |
|---|---|---|
| 2011/0235408 A1 | 9/2011 | Minemura et al. |
| 2011/0273927 A1 | 11/2011 | Hanzawa et al. |
| 2011/0284817 A1 | 11/2011 | Sasago et al. |
| 2011/0297911 A1 | 12/2011 | Shima et al. |
| 2012/0074368 A1 | 3/2012 | Sasago et al. |
| 2012/0087178 A1 | 4/2012 | Watanabe et al. |
| 2012/0211717 A1* | 8/2012 | Kinoshita et al. .......... 257/2 |

FOREIGN PATENT DOCUMENTS

| | | |
|---|---|---|
| JP | 2006-302465 A | 11/2006 |
| JP | 2008-160004 A | 7/2008 |
| JP | 2008-251059 A | 10/2008 |
| JP | 2011-233831 A | 11/2011 |
| JP | 2011-253941 A | 12/2011 |
| JP | 2012-74542 A | 4/2012 |

* cited by examiner

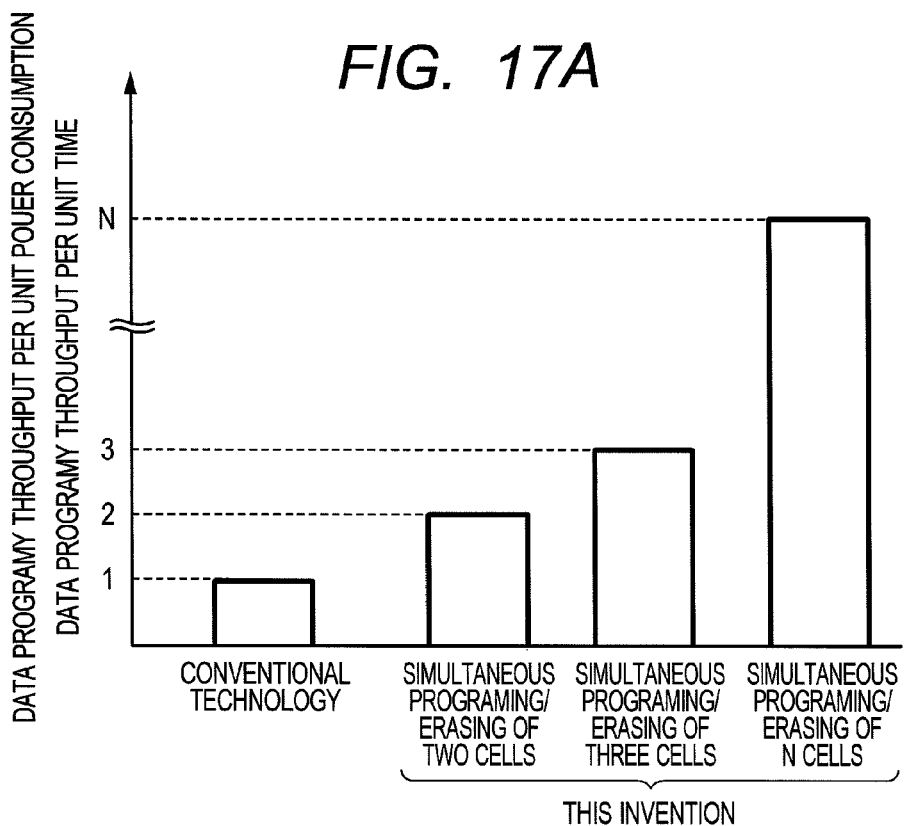
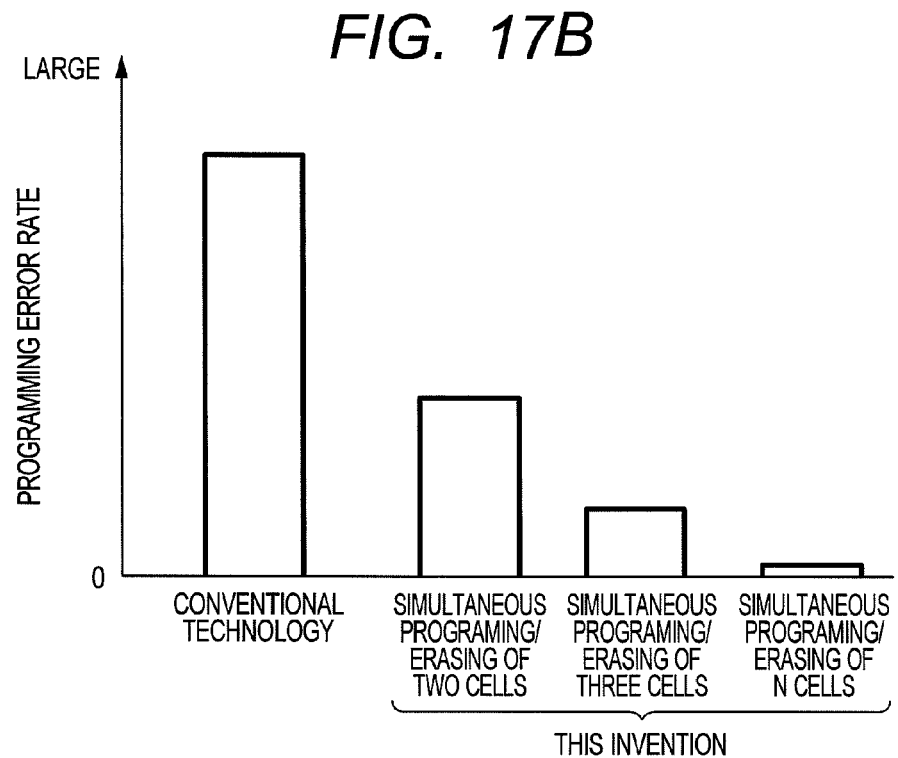

PROGRAMMING SEQUENCE

RESET PROGRAMMING SEQUENCE
AFTER SET OPERATION OF ALL CELLS

SEMICONDUCTOR STORAGE DEVICE

This application is the National Phase of PCT/JP2011/004751, filed Aug. 26, 2011.

TECHNICAL FIELD

This invention rerates to a semiconductor storage device.

BACKGROUND ART

Recently, phase change memories (Patent Literature 1, 2) using chalcogenide materials as storage materials have been actively studied. A memory structure of the phase change memory is a structure in which the recording material is sandwiched by metal electrodes. The phase change memory is a variable resistance type memory that memorizes information by using a phenomenon in which the recording material between the electrodes has different resistance states.

The phase change memory memorizes information by using a phenomenon in which resistivities of the phase change materials such as $Ge_2Sb_2Te_5$ are different in an amorphous state and a crystal state. The phase change memory has higher resistance in the amorphous state and has lower resistance in the crystal state. Therefore, read is performed by biasing voltage difference across an element, measuring current flown through the element and determining whether the resistance state of the element is high or low.

The phase change memory performs data programing/erasing by changing electric resistance of a phase change film in different states by Joule heat generated by current. A reset operation, in other words, an operation to change into the amorphous state being high resistance is performed by melting the phase change material by biasing large current for a short time, and thereafter by quenching by rapid decrease in the current. On the other hand, a set operation, in other words, an operation to change into the crystal state being low resistance is performed by biasing sufficient current to maintain crystallization temperature of the phase change material for a long period. This phase change memory is suitable for reduction of memory cell size in principle because, when the reduction of memory cell size of the phase change memory proceeds, required current to change a state of a phase change film becomes lower. Therefore, the phase change memory has been actively studied.

As a method for integrating the memory using these variable resistance type elements, Patent Literature 1 discloses constitution in which, in stacked structure formed by alternately stacking a plurality of gate electrode materials and insulator films, a plurality of through holes that pass through the entire layers is collectively patterned, and a gate insulator film, a channel layer, and a phase change film are formed and patterned on the inside of the through holes.

CITATION LIST

Patent Literature

Patent Literature 1: Japanese Patent Application Publication No. 2004-272975

Patent Literature 2: Japanese Patent Application Publication No. 2005-260014

Patent. Literature 3: Japanese Patent Application Publication No. 2008-160004

SUMMARY OF INVENTION

Technical Problem

In order to increase a data programing throughput of the semiconductor storage device using the variable resistance type element such as the phase change memory, a method for programing data in parallel, that is, simultaneously to a plurality of memory cells is effective. It is possible that the more the number of memory cells that are programed in parallel, the faster the programing throughput. In a programing method used in, conventional technologies, however, increase in the programing throughput by increase in a degree of parallelism has limitation because power consumption at the time of programing of the entire semiconductor storage device increases in proportion to the number of memory cells that are simultaneously programed. A first purpose of this invention is to increase the number of memory cells that are simultaneously programed without increasing the power consumption of the semiconductor storage device and to provide the semiconductor storage device having high programing speed.

In a conventional programing/erasing method for the phase change memory, when element resistance in a reset state becomes too high, high voltage is required in order to generate sufficient Joule heat for crystallization by biasing current to the element at the time of a subsequent set operation. Consequently, a problem that the set operation cannot be performed because required voltage for the set operation becomes higher than the voltage that the semiconductor storage device can generate has arisen. A second purpose of this invention is to provide a semiconductor storage device that can stably perform the set operation even when the resistance in the reset state is high.

In the conventional programing method for the phase change memory, a problem that heat generated in a programing-target memory cell and a wire passing current to the programing-target memory cell is conducted to surrounding memory cells, which are not the target for the programing, to cause programing error at the time of programing has arisen. When the memory cell is highly integrated, a distance between memory cells and a distance between a memory cell and a wire becomes short, and thereby frequency of programing error is increased. This prevents higher integration of the semiconductor storage devices. A third purpose of this invention is to provide a semiconductor storage device that suppresses programing error generated at the time of programing to the memory cell.

The above-described and other purposes and novel characteristics of this invention will be clarified from the description of the specification and the accompanying drawings.

Solution to Problem

Among means to solve the problems according to this invention, representative examples are briefly described below.

A semiconductor storage device includes: a first word line; a first bit line; and N first memory cells (N is an integer of 3 or more) each including a first memory element in which memory information is programed by current; and a first transistor in which a source-drain path of the first transistor is connected in parallel to the first memory element, and provided between the first word line and the first bit line; in which each of the N first memory elements is serially connected to each other; a resistivity of the first transistor is lower than that of the first memory element in a first state and higher than that of the first memory element in a second state; and in a state in which a first value is memorized in all of the N first memory elements, a control in which M first transistors (M is an integer 2 or more and less than N) in the N transistors are set to the second state, and remaining (N-M) transistors are set to the first state, and a first voltage difference is biased for memorizing a second value that is different from the first value to the M first memory elements is performed.

A semiconductor storage device includes: a first selected line provided over a semiconductor substrate; a second selected line provided over the first selected line; N first semiconductor layers (N is an integer of 3 or more) stacked through insulator films over the semiconductor substrate; a first gate insulator film layer provided along the side surfaces of the N first semiconductors; a first channel layer provided along the side in the side surfaces of the first gate insulator film layers where the first semiconductor layer are not provided, and electrically connected to the first selected line and the second selected line; and a first variable resistance material layer provided along the side in the side surfaces of the first channel layer where the first gate insulator film layers are not provided, electrically connected to the first selected line and the second selected line, and including a material that varies a resistivity by flown current, in which, when a resistivity of the first channel layer is compared with a resistivity of a part of the first variable resistance material layer adjacent to the first semiconductor layer, the resistivity of the first channel layer side is lower than the resistivity of the first variable resistance material layer side when a first voltage is biased to the adjacent first semiconductor layer, and the resistivity of the first channel layer side is higher than the resistivity of the first variable resistance material layer side when a second voltage is biased to the adjacent first semiconductor layer; and in a state in which a resistivity of a part of the first variable resistance material layer adjacent to the N first semiconductor layers is a first resistivity, a control in which the second voltage is biased to M first semiconductor layers (M is an integer of 2 or more and less than N) in the N first semiconductor layers, and, the first voltage is biased to remaining (N-M) first semiconductor layers, and thereafter, a third voltage difference changing the resistivity in a part of the first variable resistance material layer adjacent to the first semiconductor layer to which the second voltage is biased to a second resistivity is biased between the first selected line and the second selected line is performed.

Advantageous Effects of Invention

According to this invention, a semiconductor storage device having high reliability can be provided.

BRIEF DESCRIPTION OF DRAWINGS

FIG. 17 are graphs illustrating an effect of the first embodiment of this invention; (a) illustrates an effect of increasing a data programing throughput per unit power consumption and unit time; (b) illustrates an effect of decreasing programing error rate;

DESCRIPTION OF THE PREFERRED EMBODIMENT

Hereinafter, embodiments of this invention are described in detail based on the drawings. In all drawings for illustrating the embodiments, the same reference sign is assigned for a member having the same function and repeated description thereof is omitted. It is previously described that sections in which characteristic constitution is described are not limited to each embodiment, and a similar effect is obtained when common constitution is formed.

First Embodiment

<Device Structure of this Invention in this Application>

Figure 1:
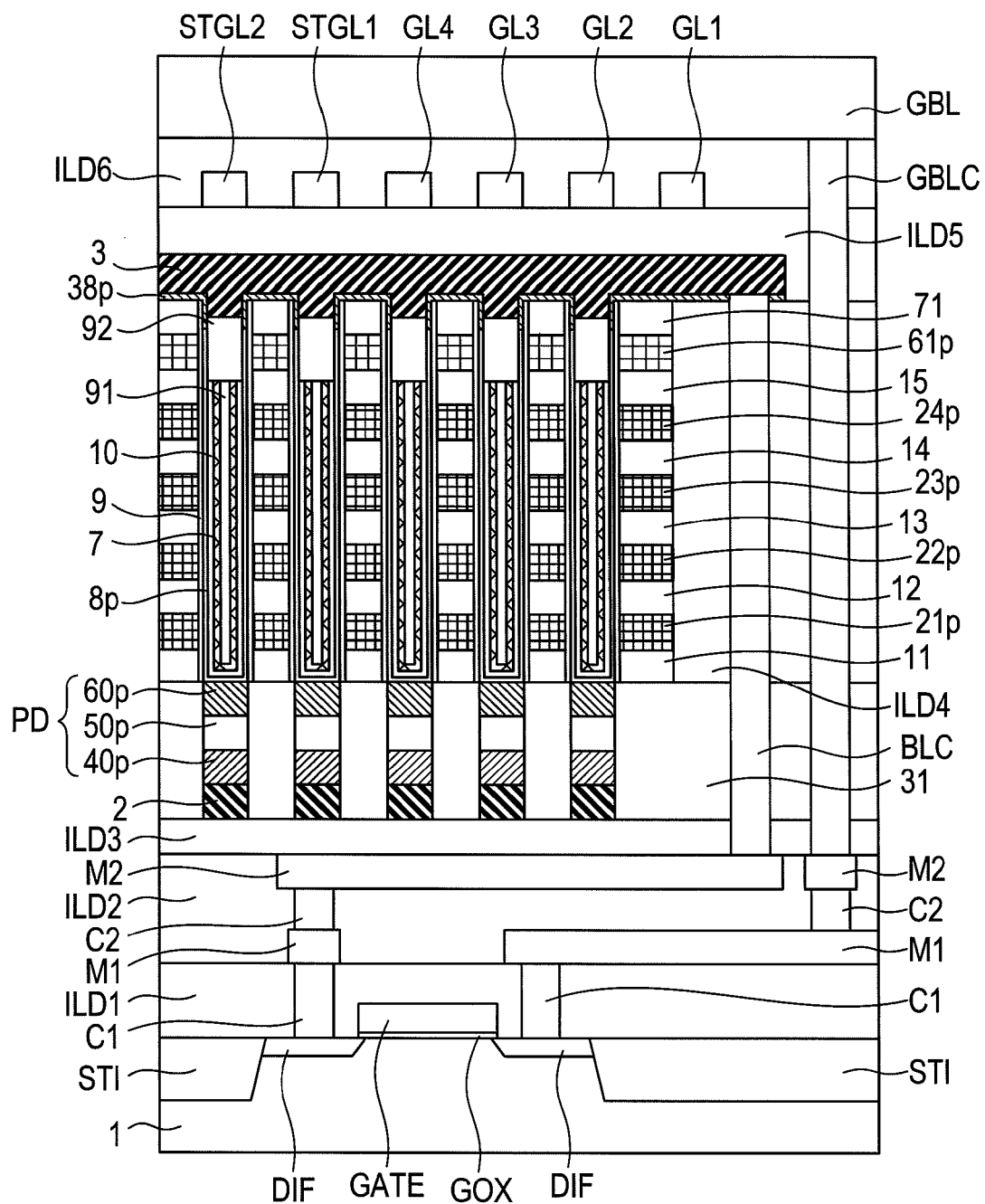
FIG. 1 is a partial cross-sectional view of a semiconductor storage device in a first embodiment of this invention.

FIG. 1 is a partial cross-sectional view of a semiconductor storage device in a first embodiment of this invention, and parts of a memory cell array, wires, and contacts are illustrated. A part constituted by element isolation grooves STI, a gate GATE of a transistor, a gate insulator film GOX, diffusion layers DIF, interpoly dielectric films ILD1, ILD2, ILD3, ILD4, ILD5, ILD6, wire layers M1, M2, contact holes C1 connecting a device on a semiconductor substrate and M1, contact holes C2 connecting M1 and M2, word lines 2 made of metal wires, polysilicon diodes PD made of polysilicon layers 40$p$ being doped with a p-type impurity, polysilicon layers 50$p$ being doped with a low concentration impurity, and polysilicon layers 60$p$ being doped with an n-type impurity, gate polysilicon layers 21$p$, 22$p$, 23$p$, 24$p$, 61$p$, metal wires GL1, GL2, GL3, GL4, STGL1, STGL2 for supplying electricity to the gate polysilicon, bit lines 3 made of metal wires, a contact hole BLC connecting the bit line 3 and a circuit formed on the semiconductor substrate 1, insulator film layers 11 between the polysilicon diode PD and the gate polysilicon layers 21$p$, insulator film layers 12, 13, 14, 15 between the gate polysilicon layers, and insulator films 71 between the gate polysilicon layer 61$p$ and the bit line 3 formed on a semiconductor substrate 1 is illustrated in FIG. 1.

Figure 2:
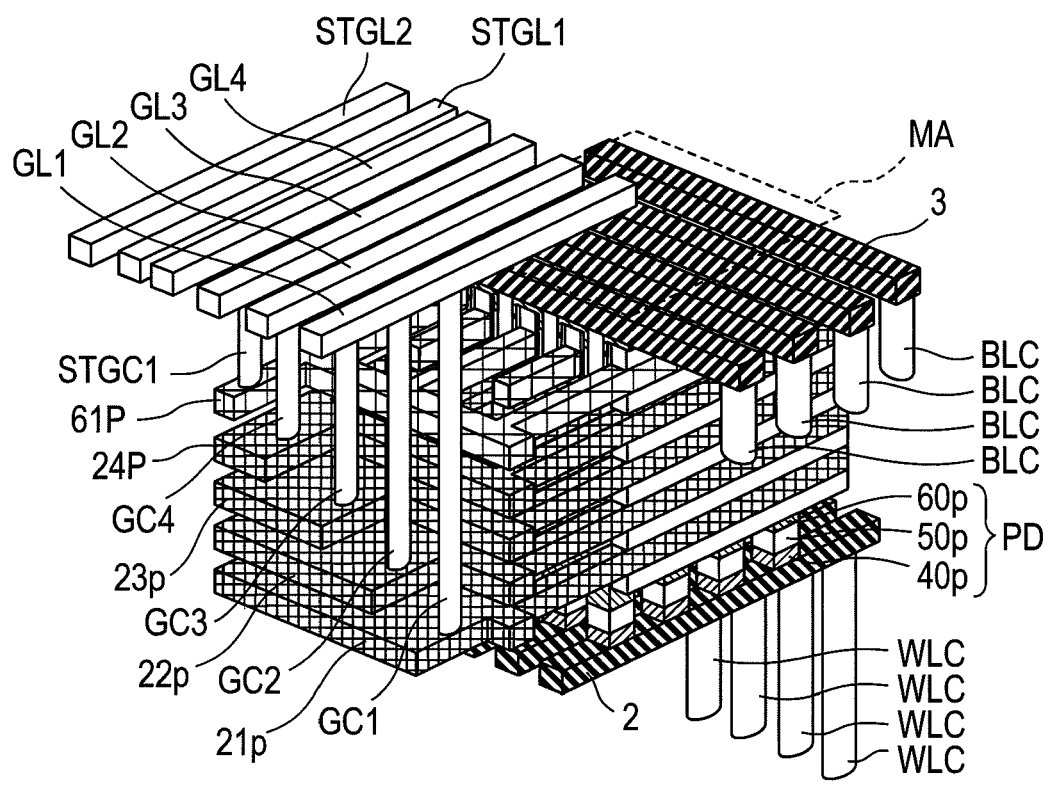
FIG. 2 is a partial three dimensional schematic view of the semiconductor storage device in the first embodiment of this invention.

FIG. 2 is a partial three dimensional schematic view of the semiconductor storage device in the first embodiment. In FIG. 2, parts of the memory cell array, the wires, and the contacts are illustrated. A part constituted by the word lines 2, a contact hole WLC connecting the word line 2 and the circuit on the semiconductor substrate 1, the polysilicon diodes PD made of the polysilicon layers 40$p$ being doped with the p-type impurity, the polysilicon layers 50$p$ being doped with the low concentration impurity, and the polysilicon layers 60$p$ being doped with the n-type impurity, the gate polysilicon layers 21$p$, 22$p$, 23$p$, 24$p$ of the memory cell, the gate polysilicon layer 61$p$ of a select transistor, the metal wires GL1, GL2, GL3, GL4 for supplying electricity to the gate polysilicon of the memory cell, the metal wires STGL1 and STGL2 for supplying electricity to the gate polysilicon layer 61$p$ of the select transistor, contacts GC1, GC2, GC3, GC4 connecting the gate polysilicon layers 21$p$, 22$p$, 23$p$, 24$p$ of the memory cell and the wires GL1, GL2, GL3, GL4 respectively, a contact STGC1 connecting the gate polysilicon layers 61$p$ of the select transistor and the wire STGL1, the bit lines 3 made of the metal wires, the contact holes BLC connecting the bit line 3 and the circuit on the semiconductor substrate land the bit line 3 are illustrated in FIG. 2. The insulator film layers 11 between the polysilicon diode PD and the gate polysilicon layer 21$p$, the insulator film layers 12, 13, 14, 15 between the gate polysilicon layers, and the insulator films 71 between the gate polysilicon layers 61$p$ are omitted for simplicity in FIG. 2.

Although not illustrated, the wires GL1, GL2, GL3, GL4 is connected to a peripheral circuit formed on the semiconductor substrate 1 through the GLC1, GLC2, GLC3, GLC4, respectively. The wires STGL1 and STGL2 are connected to the peripheral circuit through STGLC1 and STGLC2, respectively. Each of the gate polysilicon layers 21$p$, 22$p$, 23$p$, 24$p$, 61$p$ is illustrated so as to be commonly connected every other layer. The detail is described as follows.

Each of the gate polysilicon layers 21$p$, 22$p$, 23$p$, 24$p$, and 61$p$ is formed so as to form a stripe pattern of a plurality of the lines on the same plane in a part of a memory array MA (described below in FIG. 3). Among these gate polysilicon layers 21$p$, 22$p$, 23$p$, 24$p$, 61$p$, odd-numbered lines are shorted to the memory array MA in a front side in FIG. 2 and commonly connected to each other.

On the other hand, even-numbered lines in a plurality of lines of the gate polysilicon layer 21$p$, 22$p$, 23$p$, 24$p$, 61$p$ are not connected to other wires in FIG. 2, and seem to be isolated each other. However, this stripe pattern, which is not seen in FIG. 2, is connected in a similar way at the opposite side in a direction of the word line of the memory array MA.

In addition to this, the gate polysilicon layers 21$p$, 22$p$, 23$p$, 24$p$, 61$p$ are connected to the gate lines GL1, GL2, GL3, GL4, STGL2 through the contacts GC1, GC2, GC3, GC4, and STGC2. In FIG. 2, only an appearance that odd-numbered lines in each of the gate polysilicon layers are connected to the gate lines through the contacts in a front side of the memory array MA can be seen. Similar to the odd-numbered lines, even-numbered lines not illustrated in FIG. 2 have a connection relation in which the even-numbered lines are also connected to the gate lines through the contacts in the opposite side of the memory array MA.

Therefore, all of the gate polysilicon layers 21$p$ in the memory cell are connected to the same wire GL1 and shorted each other, without regard to the difference of the odd-numbered lines and the even-numbered lines of adjacent stripe patterns. Therefore, when a predetermined voltage is biased to GL1, all of the gate polysilicon layers 21$p$ have the same biased voltage. In other words, all the cells in the same plane as the gate polysilicon layers 21$p$ can collectively be selected or unselected by GL1. The gate polysilicon layers 22$p$, 23$p$, and 24$p$ also have similar structures to the gate polysilicon layers 21$p$. Therefore, according to this connection relation, selected cells/unselected cells in a Z direction (a height direction) in the memory array MA can be determined.

On the contrary, odd-numbered lines and even-numbered lines of the gate polysilicon layers 61$p$ of the select transistor are not connected to the same wire. In other words, the gate polysilicon layers 61$p$ are connected to the two wires STGL1 and STGL2 insulated each other at intervals of one line in the stripe in such a manner that an odd-numbered line is connected to the wire STGL1 and an even-numbered line is connected to the wire STGL2. As a result, voltage can individually be biased. According to this connection relation, an odd-numbered cell or an even-numbered cell in the cells having the same height in the z direction collectively selected by the gate line GL described above can be determined.

As a result, all of the entire gate polysilicon layers 21$p$ are shorted. Therefore, it seems preferable that the gate polysilicon layers are not shorted through the contact GC1 and the gate line GL1 after the odd-numbered lines and the even-numbered lines are separately shorted, but a polysilicon layer that is shorted without regarding the odd-numbered lines or the even-numbered lines is formed. However, the gate polysilicon layers 61p can have the same shape as the gate polysilicon layer 21p (and 22p, 23p, and 24p) in a manner that the odd-numbered lines and the even-numbered lines are individually shorted and the shorted odd-numbered lines and even-numbered lines are shorted through the contact and the gate line. Therefore, all of the gate polysilicon layers can be formed with the same mask, and therefore, the manufacturing cost can be significantly reduced.

Figure 3:
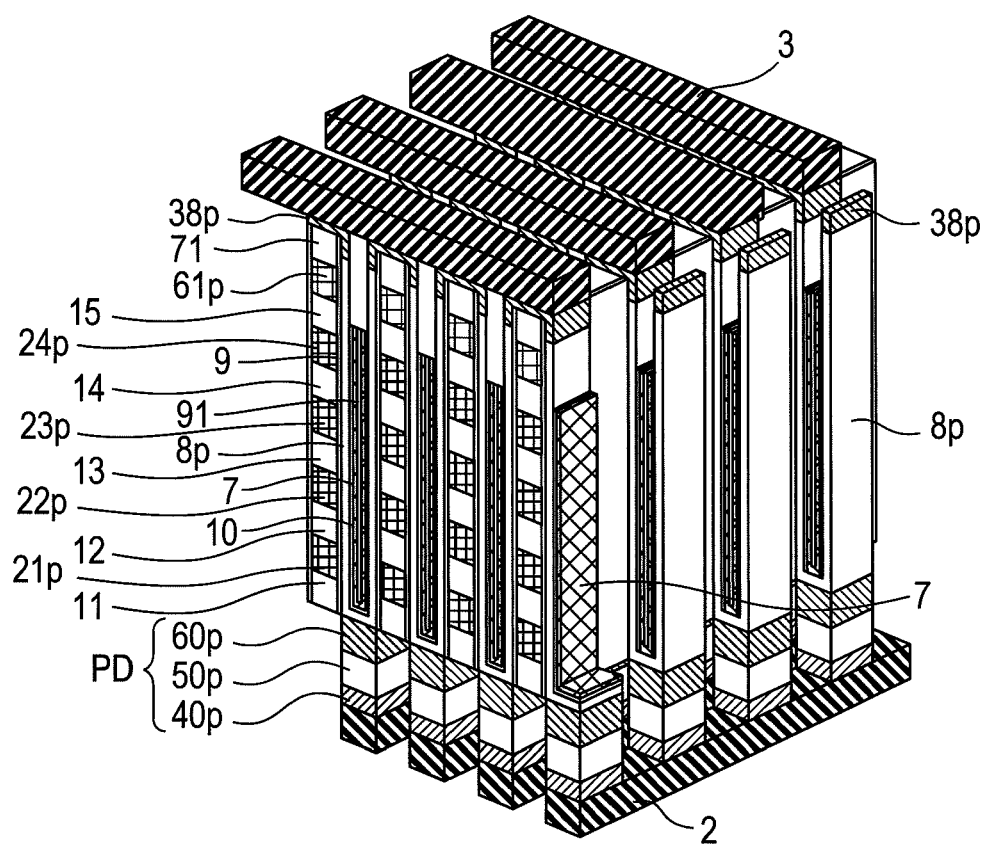
FIG. 3 is a three dimensional schematic view of a memory cell array in the first embodiment of this invention.

FIG. 3 is a view illustrating a part of the memory array MA particularly extracted from FIG. 2. Above a plurality of word lines 2, polysilicon diodes PD are periodically formed in an extending direction of the word lines 2. A stacked film made of the gate polysilicon layers 21p, 22p, 23p, 24p, 61p and the insulator film layers 11, 12, 13, 14, 15, 71 is patterned in a stripe shape in a direction parallel to the extending direction of the word line 2. This pattern is formed by a line part in which a stacked film made of the gate polysilicon layers 21p, 22p, 23p, 24p, 61p and the insulator film layers 11, 12, 13, 14, 15, 71 remains at the time of processing, and a space part in which the stacked film made of the gate polysilicon layers 21p, 22p, 23p, 24p, 61p and the insulator film layers 11, 12, 13, 14, 15, 71 is removed. Finally, as illustrated in FIG. 3, the space part is filled with a gate insulator film 9, a channel polysilicon layer 8p, a phase change material layer 7, an interpoly dielectric film 91, and the like, and the space itself does not remain. However, in order to simplify the following description, a region where "the stacked film made of the gate polysilicon layers 21p, 22p, 23p, 24p, 61p and the insulator film layers 11, 12, 13, 14, 15, 71 is removed" is referred to as the space part (even if the space is finally filled with other materials).

The line parts of the stripes of the stacked film made of the gate polysilicon layers 21p, 22p, 23p, 24p, 61p and the insulator film layers 11, 12, 13, 14, 15, 71 are arranged just above the spaces between the word lines, and the space parts of the stripes of the stacked film made of the gate polysilicon layers 21p, 22p, 23p, 24p, 61p and the insulator film layers 11, 12, 13, 14, 15, 71 are arranged just above the word lines. The bit lines 3 are the stripe shape extending in the direction perpendicular to the word lines 2, and are arranged above the insulator film 71 through the n-type polysilicon 38p.

In the lower part of the bit lines 3 in the space parts of the stacked film made of the gate polysilicon layers 21p, 22p, 23p, 24p, 61p and the insulator film layers 11, 12, 13, 14, 15, 71, the gate insulator film 9, the channel polysilicon layer 8p, an insulator film layer 10, and the phase change material layer 7 are stacked in this order in the lower part of the sidewalls of the gate polysilicon layers 21p, 22p, 23p, 24p, the sidewalls of the insulator film layers 11, 12, 13, 14 and the sidewall of the insulator film 15. The insulator film layer 10 is a layer in order to prevent diffusion between the phase change material layer 7 and the channel polysilicon layer 8p. An insulator film layer 91 is embedded between the both side surfaces of the phase change material layer 7. The gate insulator film layer 9 and the channel polysilicon layer 8p are stacked at the upper part of the sidewall of the insulator film layer 15 and the lower parts of the gate polysilicon layer 61p and the insulator film layer 71. An insulator film layer 92 is embedded between the both side surfaces of the channel polysilicon layer 8p, and the gate insulator film layer 9 and the channel polysilicon layer 38p are stacked at the upper part of the insulator film layer 71. The insulator film layer 92 is embedded between the both side surfaces of the channel polysilicon layer 8p. At the bottom part of the lower part of the bit line 3 in the space part of the stacked film made of the gate polysilicon layers 21p, 22p, 23p, 24p, 61p and the insulator film layers 11, 12, 13, 14, 15, 71, the upper surface of the polysilicon layer 6p and the channel polysilicon layer 8p are contacted. The bit line 3 and the polysilicon diode PD are connected to each other at the side surfaces of the both sides of the stacked film made of the gate polysilicon layers 21p, 22p, 23p, 24p, 61p and the insulator film layers 11, 12, 13, 14, 15, 71 through the polysilicon layer 38p, the channel polysilicon layer 8p, and the polysilicon diode PD.

In the space part of the stacked film made of the gate polysilicon layers 21p, 22p, 23p, 24p, 61p and the insulator film layers 11, 12, 13, 14, 15, 71 and the lower part of the space part of the bit line 3, the channel polysilicon layers 8p, 38p, the phase change material layer 7, and the insulator film layer 10 are removed to form a space part for the polysilicon diode PD above the word line 2. Although being omitted in FIG. 3 because of understandability, an insulator film 32 is embedded in the space part. More specifically, the channel polysilicon layers 8p, 38p, the phase change material layer 7, and the insulator layer 10 are formed in a region surrounded by the stacked film made of the gate polysilicon layers 21p, 22p, 23p, 24p, 61p and the insulator film layers 11, 12, 13, 14, 15, 71 and the insulating layer 32.

The semiconductor storage device of this invention memorizes information by using a phenomenon in which phase change materials such as $Ge_2Sb_2Te_5$ included in the phase change material layer 7 has different resistivities in an amorphous state and a crystal state. The phase change memory has higher resistance in the amorphous state and has lower resistance in the crystal state. Therefore, the read is performed by biasing voltage difference across the variable resistance type element, measuring current flown through the element, and thereby determining whether the resistance state of the element is high or low.

<Temperature Characteristics of Phase Change Material>

Figure 4:
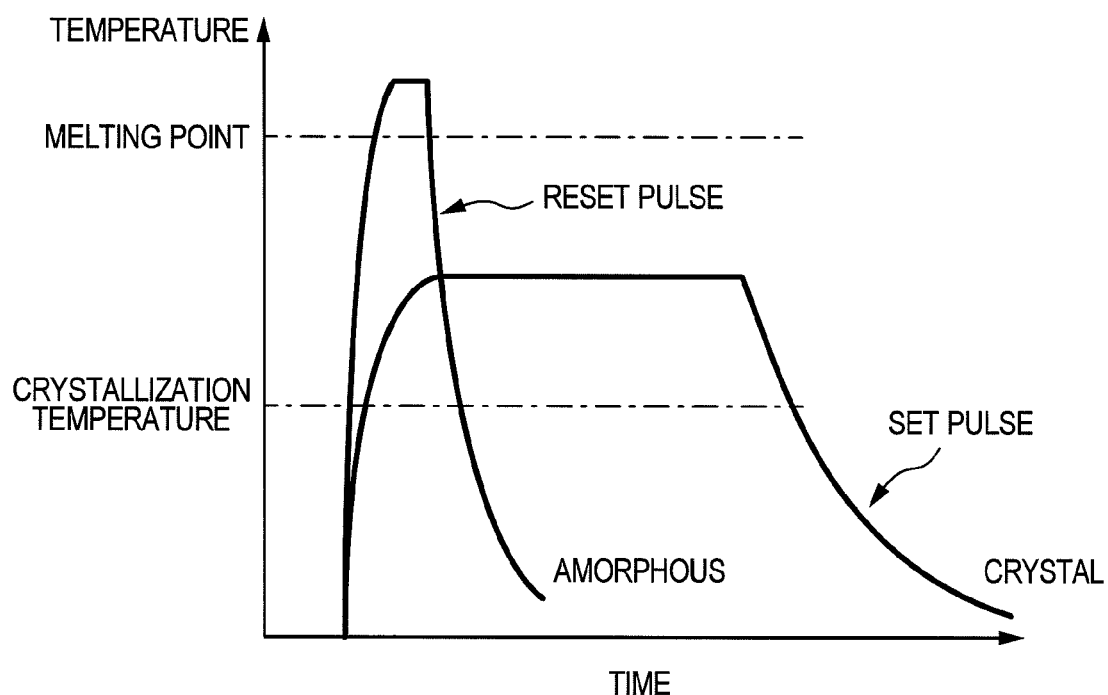
FIG. 4 is graph illustrating operations for achieving higher resistance and lower resistance of a phase change memory of this invention.

FIG. 4 is a graph illustrating temperature change in a recording layer at the time of programing/erasing operation of the phase change memory in the first embodiment of this invention. An operation in which the phase change material is changed from the amorphous state being high resistance to the crystal state being low resistance, that is, the set operation, and, on the contrary, an operation in which the phase change material is changed from the crystal state being low resistance to the amorphous state being high resistance, that is, the reset operation are performed by temperature change such as change in FIG. 4 is applied to the phase change material. Specifically, the amorphous state of the phase change material can be turned into the crystal state by heating the material equal to or higher than the crystallization temperature and maintaining the temperature for $10^{-6}$ seconds or more. On the contrary, the crystal state of the phase change material can be turned into the amorphous state by heating the material up to a temperature equal to or higher than the melting point to turn into a liquid state, and then rapidly quenching.

<Operation Principle at the Time of Programing/Erasing Cell One by One>

Figure 5:
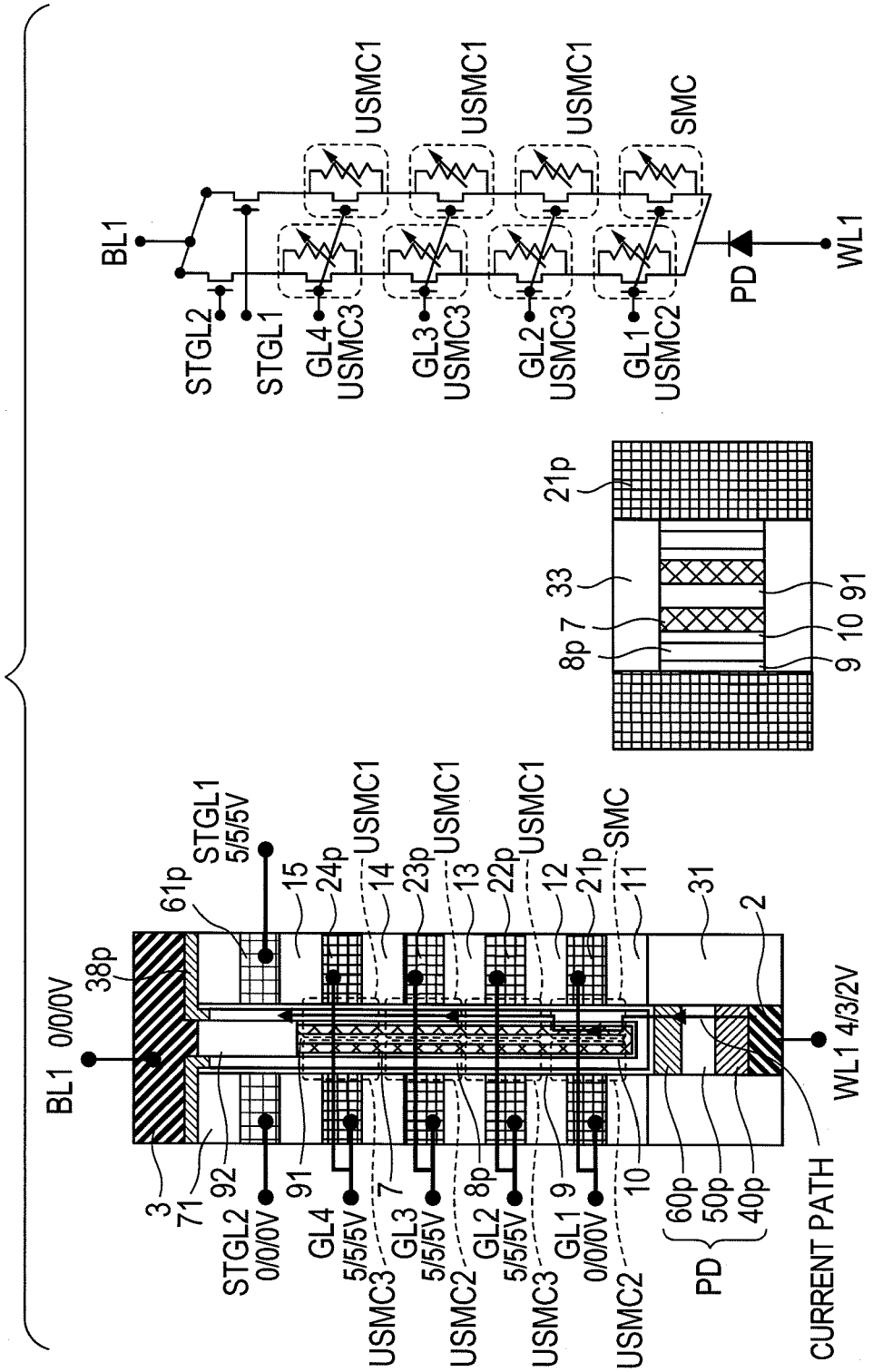
FIG. 5 is a view illustrating a conventional example of a reset operation, a set operation and a read operation of the memory cell array.

FIG. 5 is a view illustrating a part extracted from the memory cell array MA in the first embodiment. The extracted view is illustrated with a top view of one gate polysilicon layer 21p and an equivalent circuit diagram. Although the insulator film layer 31 is omitted in FIG. 2 and FIG. 3 because of understandability, the insulator film 31 is an insulator film embedded in the space between PDs.

Cells to which the memory cell to which the transistor and the phase change element described above are parallelly connected are serially connected, that is, a chain cell can perform, for example, the following operations (in the following description, when simply described "0 V", it means that 0 V is biased in every case that is at the time of the reset operation, at the time of the set operation, or at the time of read operation). 0 V is biased to the gate line GL1 connected to the selected cell SMC, and a transistor determining the channel polysilicon layer 8*p* as a channel is set to the OFF state. 5 V is biased to gate lines GL2, GL3, GL4 not connected to a selected cell SMC to set the transistor to the ON state. 0 V is biased to a bit line BL1, and 4, 3 and 2 V are biased to a word line WL1 at the time of the reset operation, the set operation and the read operation, respectively. In the gate polysilicon of the select transistor, 5 V is biased to a gate to which SMC is connected, that is, STGL1, and the transistor is set to the ON state. 0 V is biased to the gate to which SMC is not connected, that is, STGL2, and the transistor is set to the OFF state. In the unselected cell USMC1, in which the transistor is in the ON state, the channel has low resistance. The channel polysilicon layer 8*p* of STGL1, which is in the ON state, also has low resistance. Almost same current can be flown not depending on the state of the phase change material layer 7 in the USMC1 part. In SMC, current flows through the phase change material layer 7 because the transistor is in the OFF state. At the time of the reset operation and the set operation, the operations are performed by changing the resistivity of the phase change material 7 by current flown through the phase change material layer 7 using SMC. At the time of the read operation, the operation is performed by determining a current value flown through the phase change material layer 7 using SMC. The transistors of the unselected cell USMC2 and unselected cell USMC3 have common gate voltage with the transistors of SMC and USMC1. As a result, the transistor of USMC2 is in the OFF state and the transistor in USMC3 is in the ON state. Current passing through USMC2 and USMC3 is not flown, because the select transistor in which STGL2 is connected to the gate polysilicon layer 61*p* is in the OFF state. Therefore, current flows through the phase change material layer 7 only in SMC, and selective operation is possible. In order to illustrate a shape of the phase change element viewing from the upper surface, a cross-sectional view of the vertical type chain memory taken, along the horizontal surface is also illustrated in FIG. 5.

Figure 6:
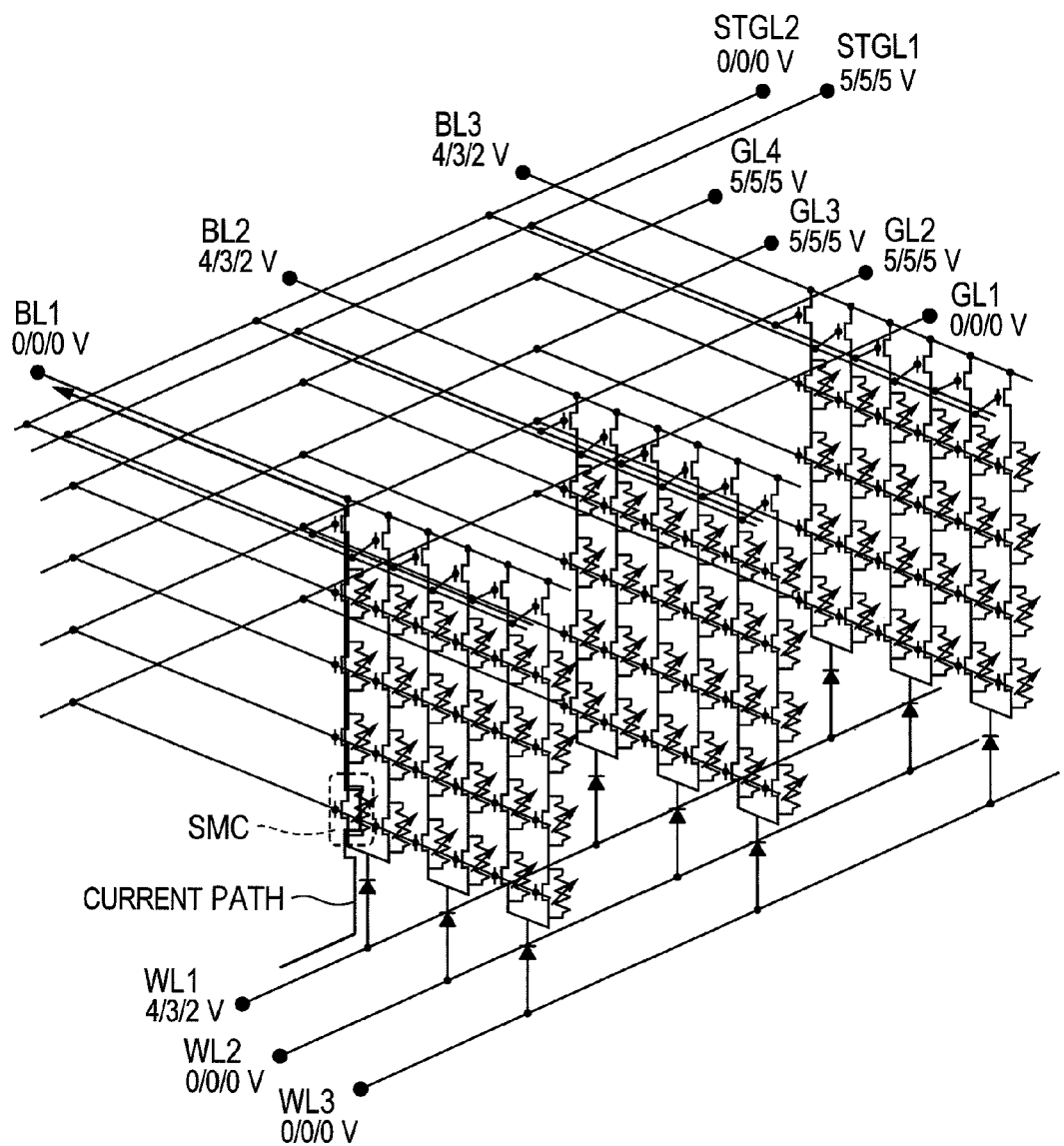
FIG. 6 is a view illustrating the conventional example of the reset operation, the set operation, and the read operation of the memory cell array.

In FIG. 6, relations of voltages among the bit lines BL1, BL2, BL3, BL4, the word lines WL1, WL2, WL3, WL4, the gate signal lines GL1, GL2, GL3, GL4, and the gate signal lines STGL1, STGL2 at the time of performing the reset operation, the set operation and the read operation are illustrated.

Similar to FIG. 5, voltages of WL1, that is, 4/3/2 V, are voltages at the time of the reset operation, the set operation, and the read operation, respectively. Similarly, notations of voltages of other terminals in FIG. 6 represent voltages at the time of the reset operation, at the time of the set operation and at the time of the read operation in this order. In a vertical type chain memory in which the bit line side is connected to BL2, BL3, or BL4 and the word line side is connected to WL1, both voltages of the bit line and the word line are 4 V at the time of the reset operation, 3 V at the time of the set operation, and 2 V at the time of the read operation. As a result, current does not flow because the bit line and the word line have no voltage difference. In a vertical type chain memory in which the bit line side is connected to BL1 and the word line side is connected to WL2 or WL3, both voltages of the bit line and the word line are 0 V at the time of the reset operation, at the time of the set operation, and at the time of the read operation. As a result, current does not flow because the bit line and the word line have no voltage difference. In the vertical type chain memory in which the bit line side is connected to BL2, BL3 or BL4 and the word line side is connected to WL2 or WL3, 0 V and 4 V are biased to the word line and the bit line respectively at the time of the reset operation; 0 V and 3 V are biased to the word line and the bit line respectively at the time of the set operation; and 0 V and 2 V are biased to the word line and the bit line respectively at the time of the read operation. Voltages are biased in a reverse bias direction of the polysilicon diode PD that selects the vertical type chain memory. The memory cell array can be manufactured so that OFF current in a reverse bias direction of the polysilicon diode PD is sufficiently reduced.

Only the vertical type chain memory in which the bit line side is connected to BL1 and the word line side is connected to WL1 can bias the forward bias to PD to flow current. As a result, SMC in the memory array can be selected and operated because SMC in the vertical type chain can be selected and operated by the method described in FIG. 5.

<Simultaneous Programing/Erasing of Cells>

A set operation and a reset operation of memory cells that further reduce power consumption can be performed as follows.

<Method for Setting all Cells in Set State>

Figure 7A:
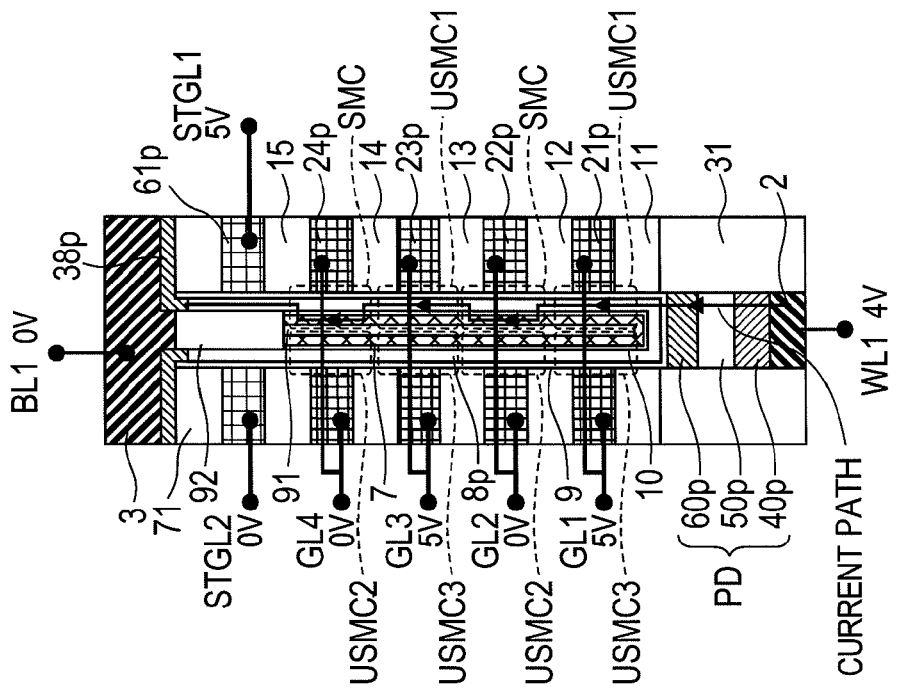
FIG. 7 are views illustrating the set operation performed before data programing to the semiconductor storage device in the first embodiment of this invention; (a) illustrates the simultaneous set operation to a first layer and a third layer in a selection chain; (b) illustrates the simultaneous set operation to a second layer and a fourth layer in the selection chain.
Figure 7B:
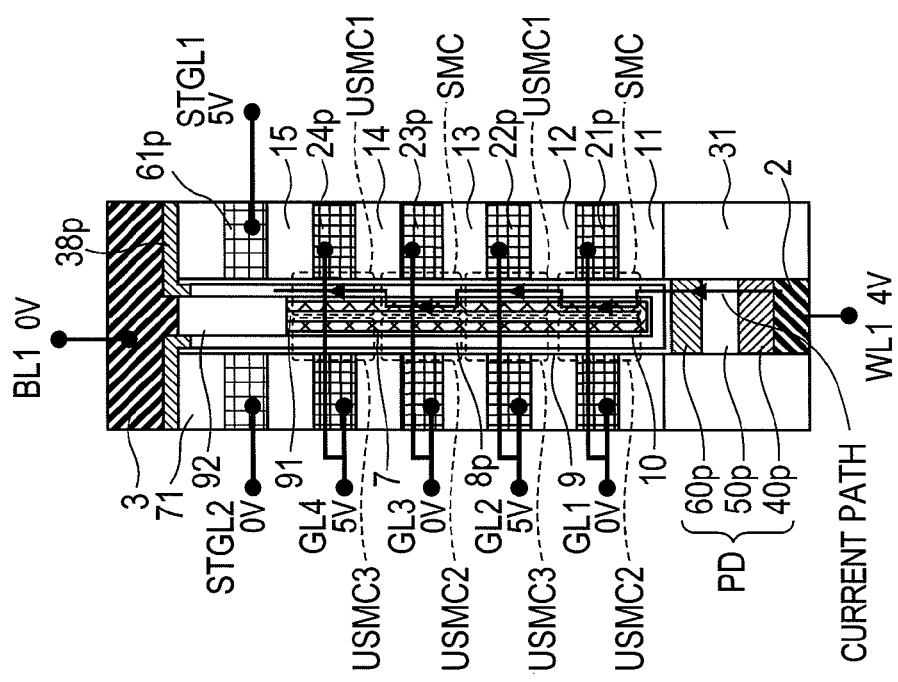

First, all cells in each chain memory are set to the set state when data programing/erasing of the chain memory is performed. As a method in this case, for example, cells can be set to the set state one by one by the method illustrated in FIG. 5. It is also possible that a plurality of cells in the chain are simultaneously selected to perform the set operation as illustrated in FIGS. 7(*a*) and 7(*b*). Odd-numbered cells in the chain cell selected in the operation in FIG. 7(*a*) are selected and the set operation is simultaneously performed, and even-numbered cells in the chain cell selected in the operation in FIG. 7(*b*) are selected and the set operation is simultaneously performed.

As described above, the reason why programing is performed so as not to simultaneously set the adjacent cells at the same time, such as selecting an odd-numbered cell and thereafter selecting an even-numbered, is based on the following reason. For example, when the set operation is simultaneously performed to cells corresponding to an odd-numbered gate 21*p* and an even-numbered gate 22*p* in a noticed chain, current flows to a phase change material 7 at an altitude of the gate 21*p* and a phase change material 7 at an altitude of the gate 22*p* that form two cells, as well as current flows from the lower edge to the upper edge of an entire phase change material 7 at a boundary part between two cells, that is, the entire phase change material 7 at an altitude of the insulator film 12. This may cause excessive reduction in resistance at this part. When the resistivity is reduced too much, resistivity in the entire chain is changed by programing/erasing even when resistivity of the phase change material in the cell part is set to the same value. As a result, problems of reduction in reliability caused by reading error and increase in cost because of requirement of an additional circuit for controlling to prevent the reading error arise. These problems can be solved by programing so as not to flow current from the lower edge to the upper edge of the phase change material 7 at an altitude of the insulator film 12. In order to achieve this, a control for not simultaneously performing programing/erasing of two cells placed just above and just below the insulator film 12, that is, the cells adjacent to each other is effective.

Control in which the number of the cells for performing the set operation at one time is set fewer (for example, m layers by m layers (m≥2)) is also possible. In this case, problems described above can be solved because programing/erasing of cells adjacent to each other is not simultaneously performed. However, the set operation needs longer time because the number of cells being set at one time is relatively decreased. Based on the above description, a method for maximize the number of cells programed/erased at one time under the requirement of "not simultaneously performing programing/erasing of the adjacent cells" is the control method described above in which the set operation is alternately performed to the odd-numbered cells and the even-numbered cells.

On the other hand, the set operation is not separately performed to odd-numbered cells and even-numbered cells, but the set operation is simultaneously performed to the odd-numbered cells and the even-numbered cells. In this case, the problem of programing/erasing the phase change material at an altitude of the insulator film 12 described above and a problem of increase in word line voltage required at the time of the set operation arise. However, this case has an advantage that the more the number of the cells in which the set operation is simultaneously performed the shorter the time for the set operation.

As described above, by simultaneously performing the set operation for a plurality of cells, all cells can be set to the set state in a short time compared with the set operation performed one by one. Required current is not increased compared with the case of performing the set operation to one cell because the serially connected cells are simultaneously selected to perform the set operation. In FIGS. 7(*a*) and 7(*b*), the set operation is separately performed to odd-numbered layers and even-numbered layers. However, as described above, methods for performing the set operation is not limited to this method, and for example, a method for simultaneously performing the set operation to all layers and a method for sequentially performs the reset operations every m layers (m≥2) from the lowest layer can be applicable.

<Method for Programing Data by Setting the Reset State to Predetermined Cell>

Figure 8:
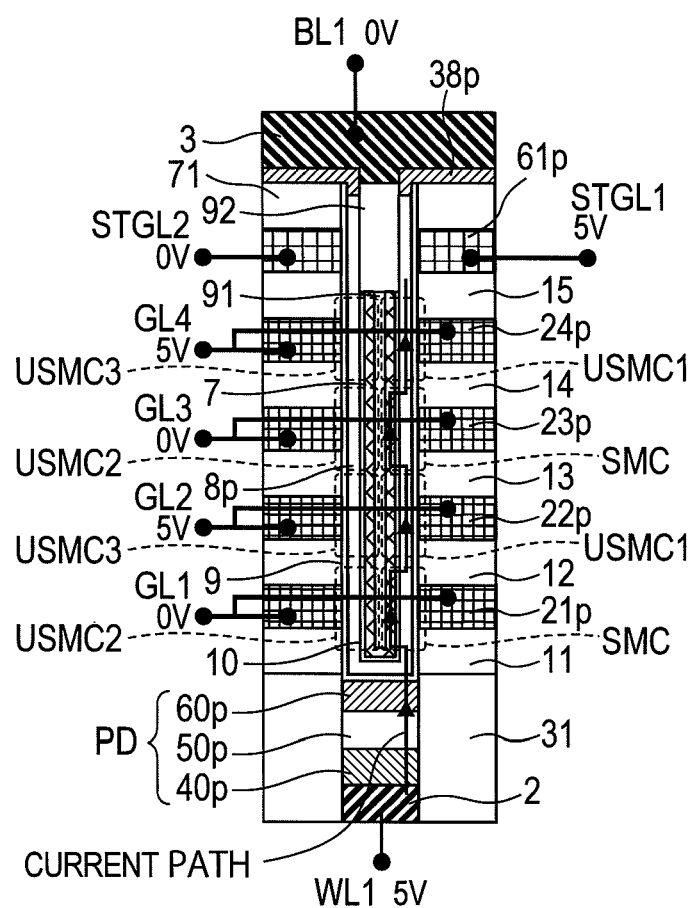
FIG. 8 is a view illustrating data programing by the reset operation to the semiconductor storage device in the first embodiment of this invention subsequently performed from the operation in FIG. 7.

At the time of programing data, only reset operation is performed to cells determined by a data pattern. At this time, the reset operation is simultaneously performed to a plurality of cells in the chain as illustrated in FIG. 8. In FIG. 8, an example in which a first layer and a third layer are simultaneously selected is illustrated. In FIG. 8, 0 V is biased to a gate lines GL1, GL3 connected to a plurality of selected cells SMC, and a transistor determining the channel polysilicon layer 8*p* as a channel is set to the OFF state. 5 V is biased to gate lines GL2, GL4 not connected to the selected cell SMC, and the transistor is set to the ON state. 0 V is biased to the bit line BL1, and required voltage for the reset operation, for example 5V, for example, 5 V is biased to the word line WL1. In the gate polysilicon of the select transistor, 5 V is biased to a gate to which SMC is connected, that is, STGL1, and the transistor is set to the ON state. 0 V is biased to the gate to which SMC is not connected, that is, STGL2, and the transistor is set to the OFF state. In the unselected cell USMC1, in which the transistor is in the ON state, the channel has low resistance. The channel polysilicon layer 8*p* of STGL1, which is in the ON state, also has low resistance. Almost same current can be flown not depending on the state of the phase change material layer 7 in the USMC1 part. In SMC, current flows through the phase change material layer 7 because the transistor is in the OFF state. In SMC, the reset operation is performed by changing the resistivity of the phase change material 7 by current flown through the phase change material layer 7 using SMC. The transistors of the unselected cell USMC2 and the unselected cell USMC3 have common gate voltage with the transistors of SMC and USMC1, respectively. As a result, the transistor of USMC2 is in the OFF state and the transistor in USMC3 is in the ON state. Current passing through USMC2 and USMC3 is not flown, because the select transistor in which STGL2 is connected to the gate polysilicon layer 61*p* is in the OFF state. Therefore, only in SMC, current flows through the phase change material layer 7, and the selective operation is possible. Thereby, data programing throughput can be increased because a plurality of cells can be programed in one operation. Required current is the same as the case of the reset operation for one cell even when the reset operation for a plurality of cells in a chain is performed, because serially connected cells are simultaneously selected. As a result, the data programing throughput per power consumption also can be increased. Depending on programed data, the case when the reset operation to the cells in the chain is not performed or the case when the reset operation to only one cell in the chain is performed exists. In the case of data for which the reset operation is performed to only one cell, the operation in FIG. 5 is performed.

In the example described above, the target cells to which the reset operation is performed are the cells being not adjacent to each other. Therefore, the "problem associated with simulators programing/erasing of the adjacent cells" described above does not arise. However, when a data pattern is "performing the reset operation for the first and the second cells", the problem associated with simultaneous programing/erasing of the adjacent cells arises. In order to prevent this problem, a control in which, first, the reset operation to "cells that are targets for reset in the data pattern and are odd-numbered" is performed, and thereafter, the reset operation to "cells that are targets for reset in the data pattern and are even-numbered" is performed is effective at the time of performing the reset operation. Specifically, when M cells are reset targets, in select transistors included in each of the M cells, first, the odd-numbered transistors are set to OFF, and thereafter, the odd-numbered transistors are set to ON, and then the even-numbered transistors are set to OFF. The data programing/erasing can be performed in higher speed with solving the problem associated with the simultaneous programing/erasing of theadjacent cells by analyzing the data pattern to perform the control described above only when the data pattern is a data pattern performing the reset operation to adjacent cells (for example, when set is determined as 0, and reset is determined as 1, a data pattern in which 1 is adjacent such as "001110~"), and to collectively perform the reset operation to all of the cells when the data pattern is a data pattern not performing the reset operation to adjacent cells (for example, a data pattern in which 1 is not adjacent such as "010010~").

<Characteristics of Simultaneous Programing/Erasing of Cells>

The memory according to this embodiment has structural characteristics described below. First, each memory cell has a memory element in which memory information is programed by current and a transistor whose source-drain path is connected in parallel to the memory element. Secondly, the transistor has a low resistivity state compared with the memory element part (an ON state), or a high resistivity state compared with the memory element part (an OFF state) depending on the gate voltage of the transistor. By the structure described above, current flows through the memory element or the transistor in each cell. In addition to this, thirdly, the memory has a structure in which the memory elements are serially connected between the memory cells. A current path from the word line to the bit line through the memory cell can be serially formed by the structures described above. Power consumption is not increased even when a plurality of cells are simultaneously set or reset.

In addition to this, characteristics of control are that all of cells are set to the set state (a state in which a first value is memorized in the memory element), and thereafter, any of the cells are set to the reset state (a state in which a second value is memorized in the memory element). For example, the case that M sells are reset and (N-M) cells are set in N cells being serially connected is considered. (In consideration of resetting cells later, the minimum number of the number of all cells N may be three. If the minimum number of the number of reset cells M is 2, this case is advantageous compared with the case of individual reset.) In this case, first, all of the N cells are set to the set state. Then, for M cells that are desired to be reset, current is made to flow through a resistance element in the cell by setting the transistors to a high resistance state (this setting voltage is biased to the gate line GL). On the contrary, for (N-M) cells that are desired to maintain the set state, current is made to flow through the transistor by setting the transistors to a low resistance state (this setting voltage is biased to the gate line GL). In addition to this, predetermined voltage is supplied to the word line and the bit line for a predetermined period. The predetermined period and the predetermined voltage mean a period and voltage that can change resistivity of recording elements contained in M cells. For example, when the recording element contains a phase change element, the predetermined period and the predetermined voltage may be a period and voltage that set the phase change element in an amorphous state, as illustrated in a dot line in FIG. 4.

By the operation described above, a rate of programing error can be reduced because, a plurality of cells can be simultaneously selected and simultaneously programed/erased; a data programing throughput is increased; and the number of disturbances associated with programing/erasing can be reduced.

The method for setting all N cells and the method for resetting M cells are as described previously.

Each memory cell is constituted as follows. First, a first selected line (a word line WL) is provided over the semiconductor substrate, and a second selected line (a bit line BL) extending in a direction that intersects with the first selected line is provided. As gates of each memory cell, N gates are provided so as to stacking a plurality of semiconductor layers (gate lines GL) each other through insulator films. A gate insulator film 9 is provided along the side surface of the gate line GL; a channel layer 8p is provided along the side where the gate line is not provided in the side surfaces of the gate insulator films; and a variable resistance material layer is provided along the side at which the gate insulator film is not provided in the side surfaces of the channel layer. Set and reset of each memory cell corresponds to changing the resistivity of a part in the variable resistance material layer adjacent to the gate electrode between the first resistivity and the second resistivity (higher than the first value), respectively. The term "adjacent" in the relation of the gate electrodes and the channel layers or the variable resistance material layers means a relation of the gate electrodes and the channel layers or the variable resistance material layers having equivalent distance to the semiconductor substrate and having the nearest position.

The memory element in each memory cell is constituted by a part of a continued recording film 7 as illustrated in FIGS. 1, 3, and 5. Similarly, in the transistor in each memory cell, the channel layer of the transistor is constituted by a continued semiconductor layer 8.p. By the characteristics described above, a memory region can be constituted in a space part of a stripe pattern and more reduction of memory cell size is possible. Double capacity per unit area can be realized because the memory region can be constituted along the both sidewalls of the space part.

As the recording element, an element in which resistivity thereof is changed by current can be applicable. The recording element preferably includes the phase change element. In this case, two resistivities can be realized by using a crystal state and an amorphous state.

<Modified Example of Simultaneous Programing/Erasing of Cells>

Figure 9A:
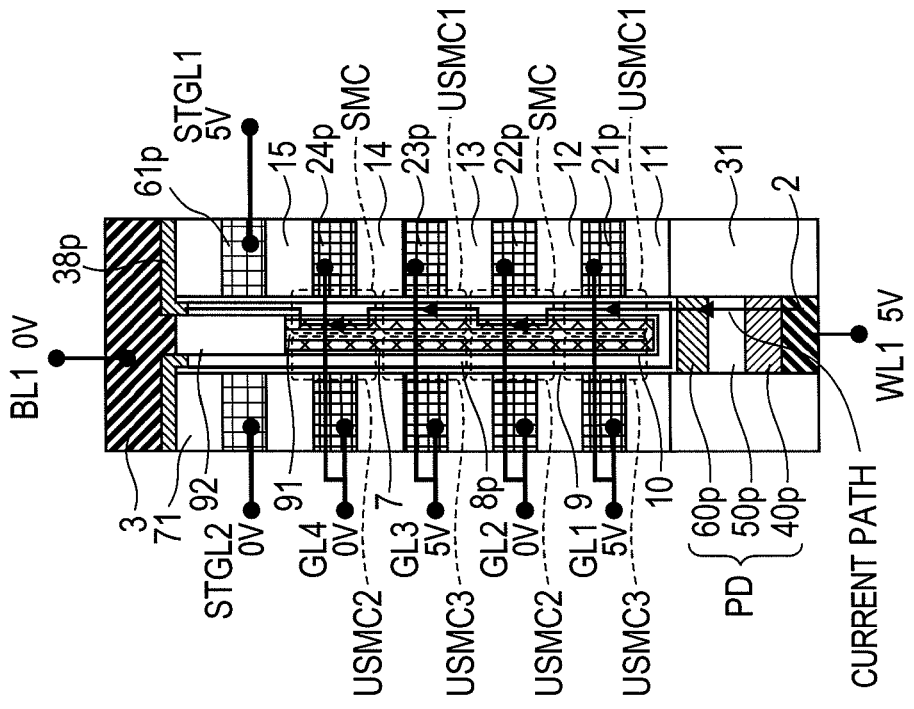
FIG. 9 are views illustrating the reset, operation performed before data programing to the semiconductor storage device in the first embodiment of this invention; (a) illustrates the simultaneous reset operation to the first layer and the third layer in a selection chain; (b) illustrates the simultaneous reset operation to the second layer and the fourth layer in the selection chain.
Figure 9B:
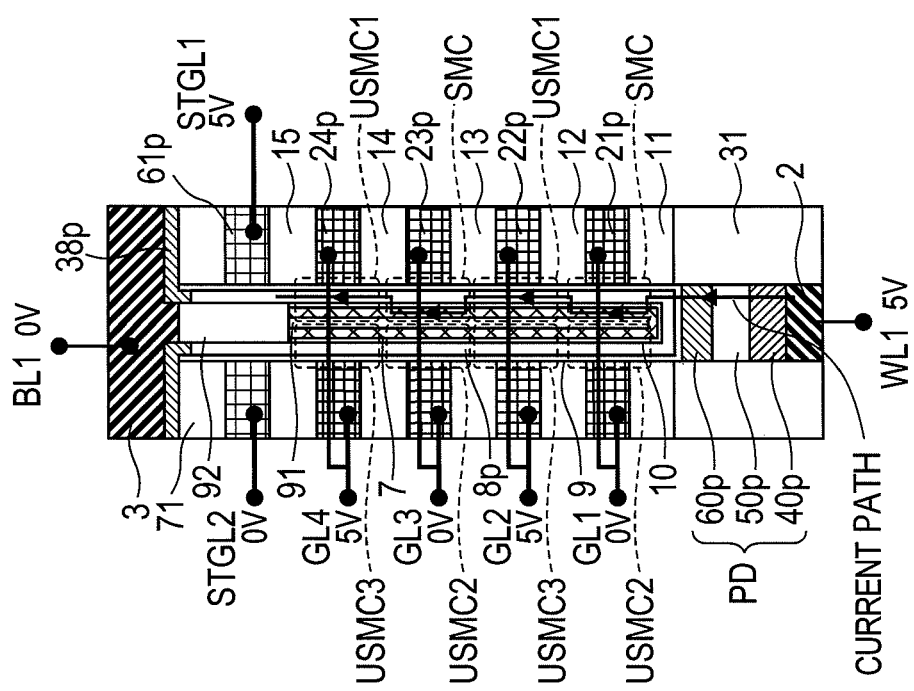
Figure 10:
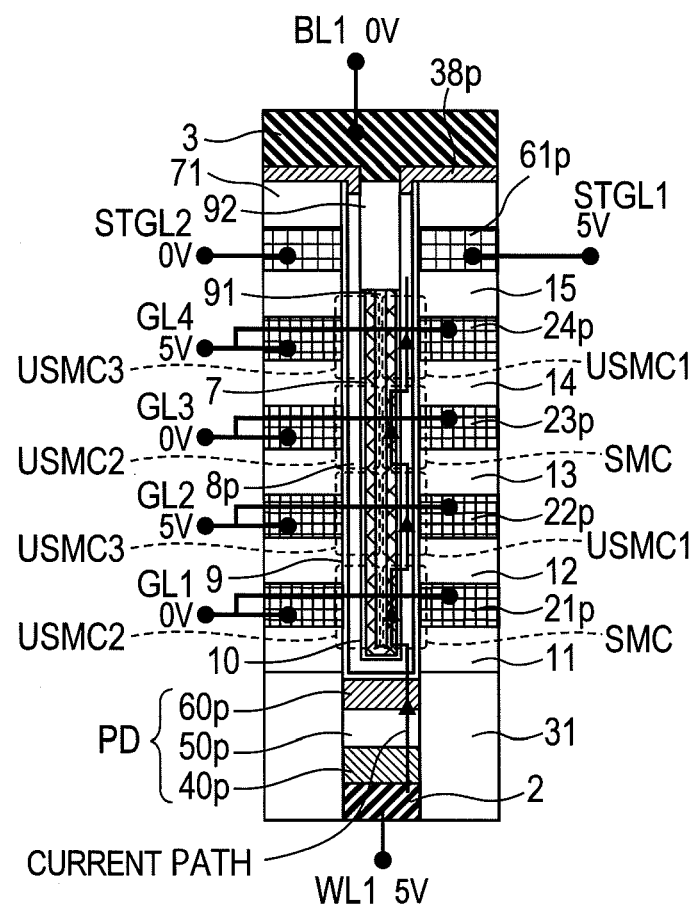
FIG. 10 is a view illustrating data programing by the set operation to the semiconductor storage device in the first embodiment of this invention subsequently performed from the operation in FIG. 9.

In examples in FIGS. 7 and 8, first, all cells in each chain memory is set to the set state when programing/erasing of the chain memory is performed. At the time of programing data, the reset operation is performed to a plurality of cells in the chain. However, similar effect also can be obtained by firstly setting all cells in each chain memory in the reset state when data programing/erasing in the chain memory is performed, and performing the set operation to a plurality of cells in the chain at the time of programing data. As a method in this case, for example, cells can be set to the reset state one by one by the method illustrated in FIG. 5. It is also possible that a plurality of cells in the chain are simultaneously selected to perform the reset operation as illustrated in FIGS. 9(a) and 9(b). Odd-numbered cells in the chain cell selected in the operation in FIG. 9(a) are selected and the reset operation is simultaneously performed, and even-numbered cells in the chain cell selected in the operation in FIG. 9(b) are selected and the reset operation is simultaneously performed. Thereby, all the cells can be set to the reset state in a short time compared with the reset operation being performed one by one. Required current is not increased compared with the case of performing the set operation to one cell because the serially connected cells are simultaneously selected to perform the reset operation. In FIG. 10, a voltage condition for the case of performing the set operation to a plurality of cells in the chain is illustrated. In FIG. 10, an example in which a first layer and a third layer are simultaneously selected is illustrated. In FIG. 10, 0 V is biased to the gate lines GL1, GL3 connected to a plurality of selected cells SMC, and a transistor determining the channel polysilicon layer 8p as a channel is set to the OFF state. 5 V is biased to the gate lines GL2, GL4 not connected to the selected cell SMC, and the transistor is set to the ON state. 0 V is biased to the bit line BL1, and voltage required for the set operation, for example 4V, is biased to the word line WL1. In the gate polysilicon of the select transistor, 5 V is biased to a gate to which SMC is connected, that is, STGL1, and the transistor is set to the ON state. 0 V is biased to the gate to which SMC is not connected, that is, STGL2, and the transistor is set to the OFF state. In the unselected cell USMC1, in which the transistor is in the ON state, the channel has low resistance. The channel polysilicon layer 8p of STGL1, which is in the ON state, also has low resistance. Almost same current can be flown not depending on the state of the phase change material layer 7 in the USMC1 part. In SMC, current flows through the phase change material layer 7 because the transistor is in the OFF state. The set operation is performed by changing the resistivity of the phase change material 7 by current flown through the phase change material layer 7 using SMC. The transistors of the unselected cell USMC2 and the unselected cell USMC3 have common gate voltage with the transistors of SMC and USMC1, respectively. As a result, the transistor of USMC2 is in the OFF state and the transistor in USMC3 is in the ON state. Current passing through USMC2 and USMC3 is not flown, because the select transistor in which STGL2 is connected to the gate polysilicon layer Glp is in the OFF state. Therefore, only in SMC, current flows through the phase change material layer 7, and the selective operation is possible. Thereby, data programing throughput can be increased because a plurality of cells can be programed in one operation. Required current is the same as the case of the set operation for one cell even when the set operation for a plurality of cells in a chain is performed, because serially connected cells are simultaneously selected. As a result, the data programing throughput per power consumption also can be increased. Depending on programed data, the case when the set operation to the cells in the chain is not performed or the case when the reset operation to only one cell in the chain is performed exists. In the case of the data for which the set operation is performed to only one cell, the operation in FIG. 5 is performed.

In the reset operation and the set operation thereafter, which cell is determined to be the programing/erasing target can be considered similar to FIGS. 7 and 8. For example, in the reset operation, a control in which simultaneously performs the reset operation to all the cells and a control in which sequentially performs the reset operations every m layers (m≤2), other than the control described in FIG. 9, are also effective. Each advantage is similar to the advantage described in FIG. 7 and other description place. In the set operation thereafter, a control that does not simultaneously set the adjacent cells and the control being performed only when needed by analyzing the data pattern, other than the control described in FIG. 10, are also effective. Each advantage is similar to the advantage described in FIG. 8 and other description place.

<Modified Example of Device Structure>

Figure 11:
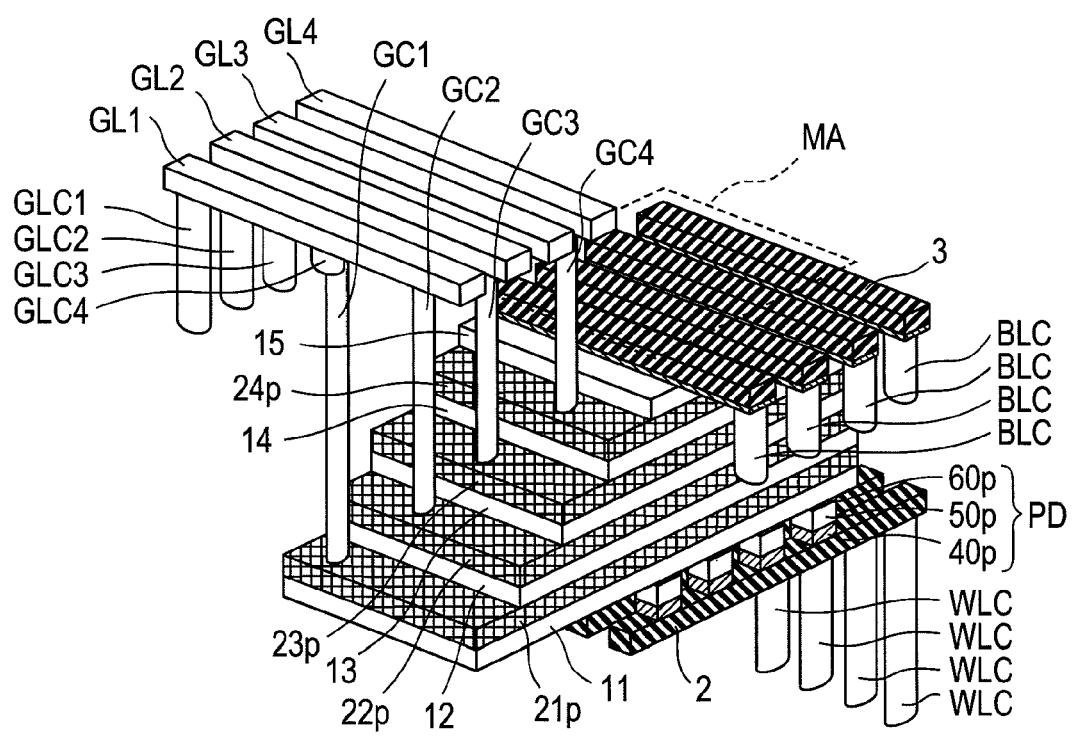
FIG. 11 is a partial three dimensional schematic view of the semiconductor storage device in the first embodiment of this invention.
Figure 12:
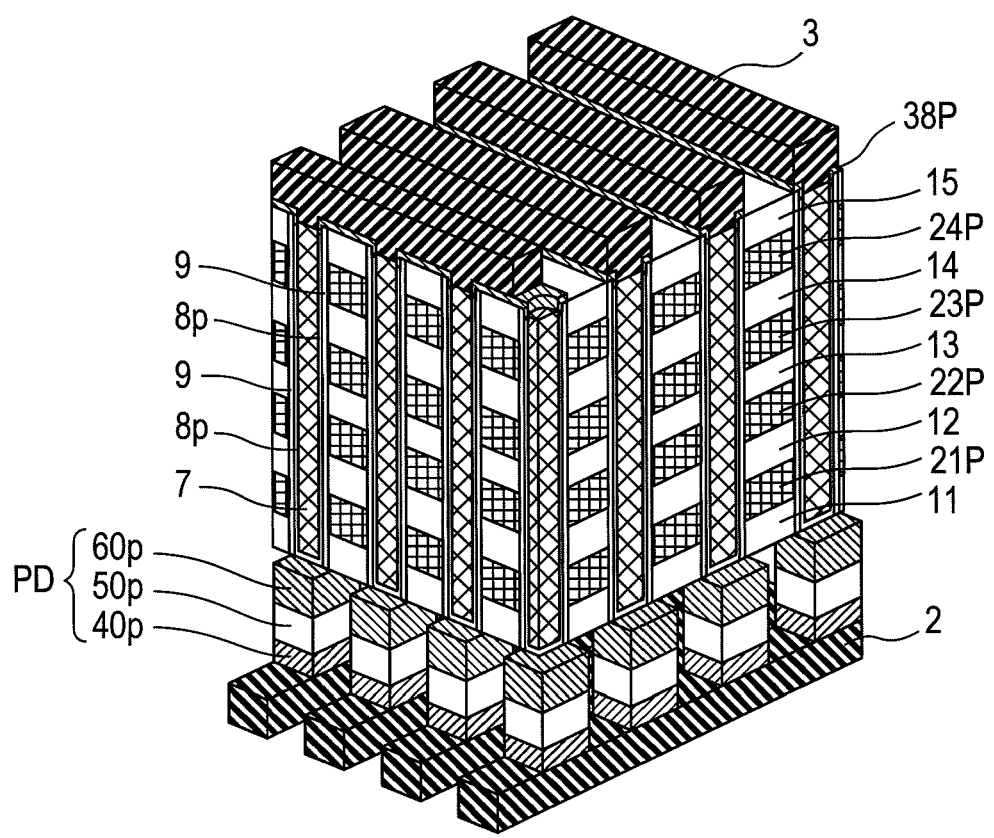
FIG. 12 is a three dimensional schematic view of the memory cell array in the first embodiment of this invention.

In FIGS. 1 to 10, the example in which two vertical type chain memories are independently operated at the intersection point of the bit line and the word line is described. As illustrated in FIGS. 11 and 12, a similar operation also can be performed in the case that one chain memory is formed at the intersection point of the bit line and the word line. This is because the chain memory is in common with the above-described chain memories in that the current path is formed from the word line to the bit line through each memory cell. FIG. 11 is a partial three dimensional schematic view of the semiconductor storage device in the first embodiment, and illustrates a part of a memory cell array, wires and contacts. A part constituted by word lines 2 made of metal wires; contact holes WLC for connecting the word line 2 and a wire selector; polysilicon diodes PD made of polysilicon layers 40$p$ in which a p-type impurity is doped, polysilicon layers 50$p$ in which a low concentration impurity is doped and polysilicon layers 60$p$ in which an n-type impurity is doped; gate polysilicon layers 21$p$, 22$p$, 23$p$, 24$p$; metal wires GL1, GL2, GL3, GL4 for supplying electricity to the gate polysilicon, contacts GC1, GC2, GC3, GC4 for connecting the gate polysilicon layers 21$p$, 22$p$, 23$p$, 24$p$ and the metal wires GL1, GL2, GL3, GL4, respectively; contacts GLC1, GLC2, GLC3, GLC4 for connecting the metal wires GL1, GL2, GL3, GL4 and the wire selector, respectively; bit lines 3 made of metal wires; contact holes BLC for connecting the bit line 3 and the wire selector; an insulator film layer 11 between the polysilicon diode PD and the gate polysilicon layer 21; insulator film layers 12, 13, 14 between the gate polysilicon layers; and an insulator film 15 between the gate polysilicon layer 24$p$ and the bit line 3 is illustrated in FIG. 11.

FIG. 12 is a view illustrating a part of the memory array MA particularly extracted from FIG. 11. Above a plurality of word lines 2, the polysilicon diodes PD are periodically formed in an extending direction of the word lines 2. Between the bit lines 3 and the polysilicon diodes PD, holes (connection holes) passing through the gate polysilicon layers 21$p$, 22$p$, 23$p$, 24$p$ and inter-gate insulator film layers 11, 12, 13, 14, 15 are formed. In the holes, gate insulator films 9, channel polysilicon layers 8$p$ and phase change material layers 7 are embedded. The hole is formed in a region where the word line 2 and the bit line 3 intersect each other.

Figure 13:
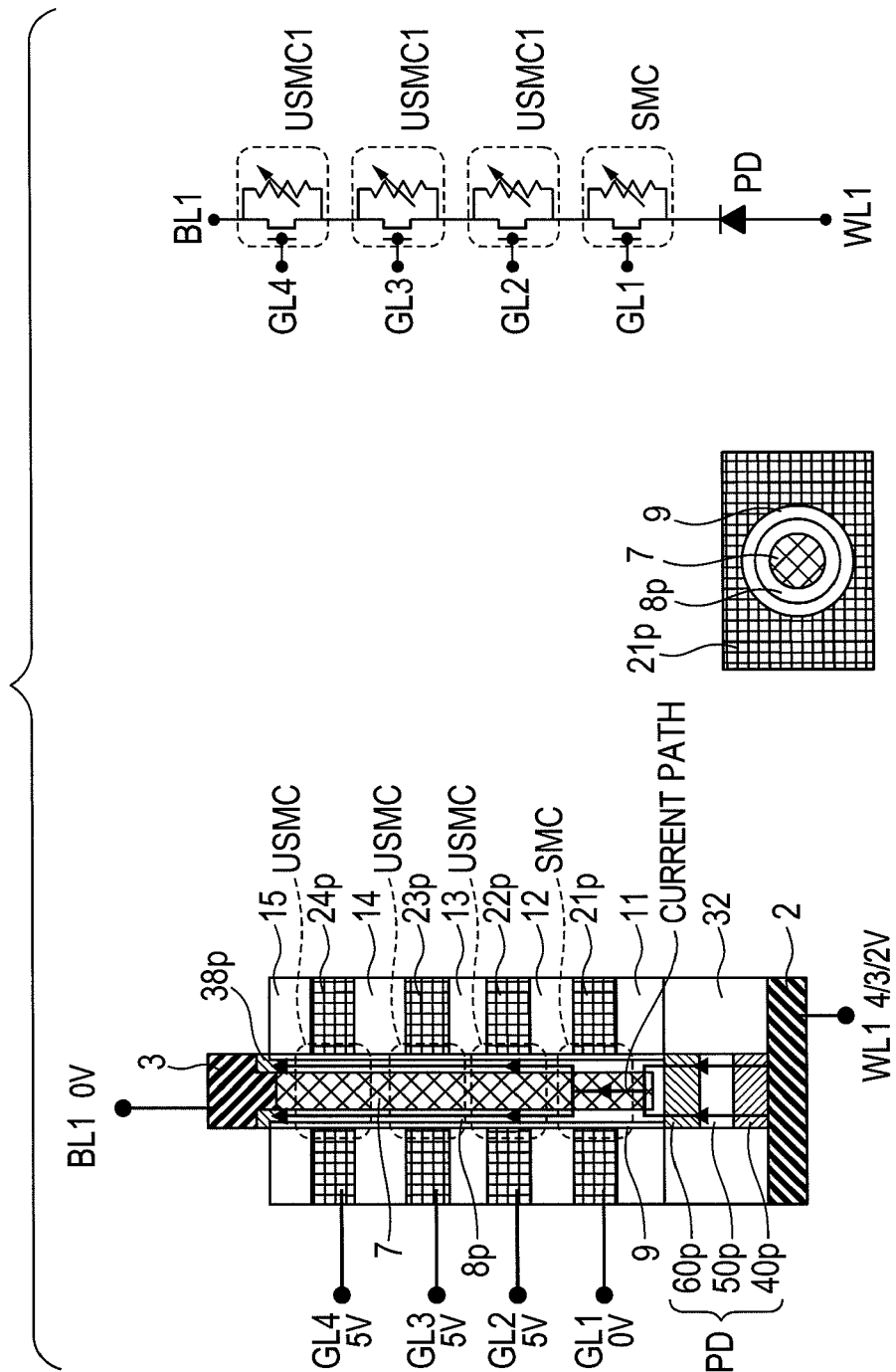
FIG. 13 is a view illustrating a conventional example of a reset operation, a set operation and a read operation of the memory cell array in FIGS. 11 and 12.

Programing/erasing the memory cell in this form can be performed by a voltage condition, for example, as illustrated in FIG. 13.

Figure 14:
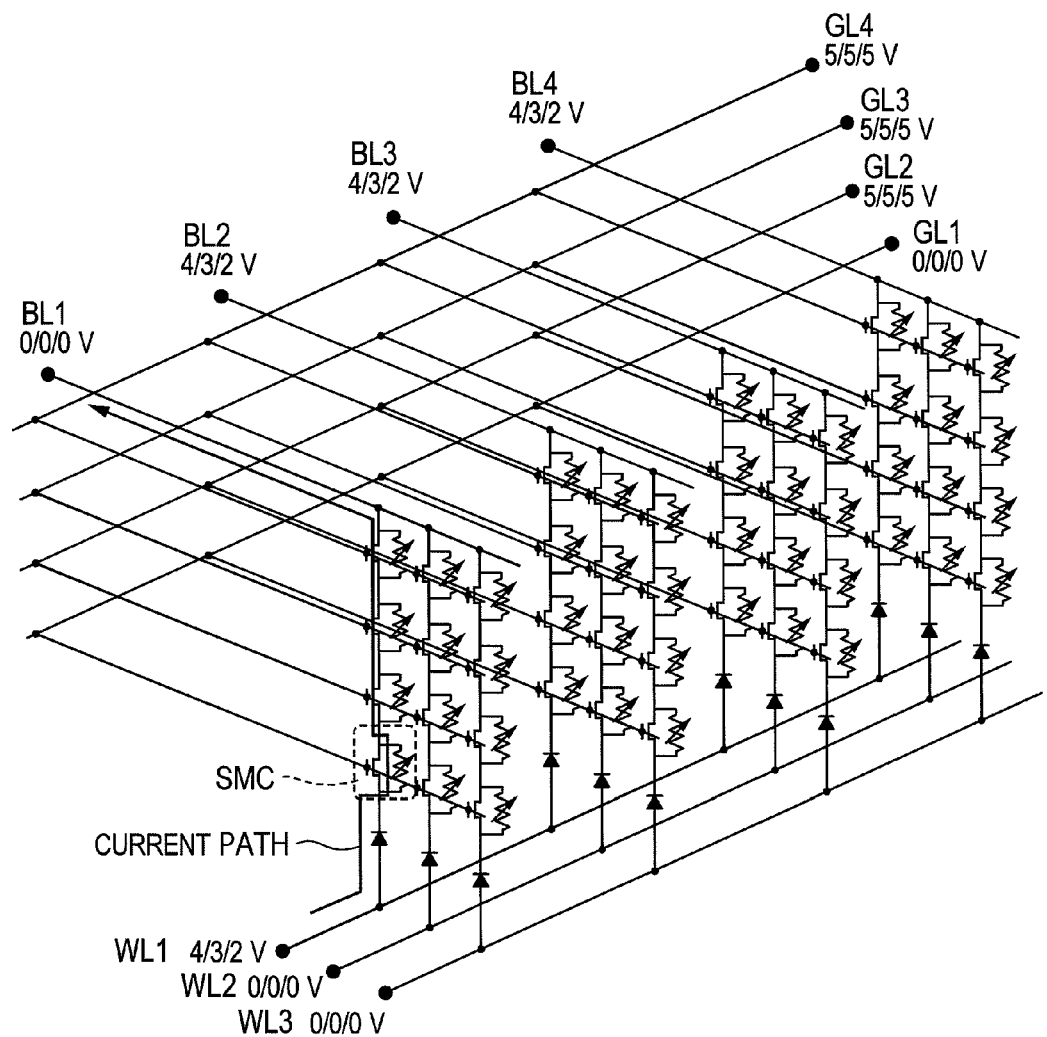
FIG. 14 is a view illustrating a conventional example of the reset operation, the set operation, and the read operation of the memory cell array in FIGS. 11 and 12.

FIG. 13 is a view illustrating a part extracted from the memory cell array. The extracted view is illustrated with a top view of one gate polysilicon layer 21$p$ and an equivalent circuit diagram corresponding to a part of the memory cell array. Although an insulator film 32 is omitted in FIG. 11 and FIG. 12 because of understandability, the insulator film 32 is an insulator film embedded in space between PDs. An operation of the memory cell is performed as follows. 0 V is biased to the gate line GL1 connected to the selected cell SMC, and the transistor using a channel polysilicon 8$p$ as a channel is set to the OFF state. 5 V is biased to the gate lines GL2, GL3, GL4 connected to the unselected cell USMC, and the transistor is set to the ON state. 0 V is biased to the bit line BL1, and 5, 4 and 2 V are biased to the word line WL1 at the time of the reset operation, at the time of the set operation, and at the time of the read operation, respectively. In the unselected cell USMC, in which the transistor is in the ON state, the channel has low resistance, and thereby current flows through the channel polysilicon 8$p$. Almost same current can be flown not depending on the state of the phase change material 7 in the USMC part. In SMC, current flows through the phase change material 7 because the transistor is in the OFF state. At the time of the reset operation and the set operation, the operations are performed by changing the resistivity of the phase change material 7 by current flown through the phase change material 7 using SMC. At the time of the read operation, the operation is performed by determining a current value flown through the phase change material 7 using SMC. The memory cell array in FIGS. 11 and 12 is constituted by a plurality of bit lines, word lines, vertical type chain memories and polysilicon diodes PD. Therefore, the reset operation, the set operation and the read operation are performed by, for example as illustrated in FIG. 6, controlling voltages of the bit lines BL1, BL2, BL3, BL4, the word lines WL1, WL2, WL3, and the gate signal lines GL1, GL2, GL3, GL4. Similar to FIG. 13, voltages of WL1, that is, 4/3/2 V, are voltages at the time of the reset operation, at the time of the set operation, and at the time of the read operation, respectively. Similarly, notations of voltages of other terminals in FIG. 14 represent voltages at the time of the reset operation, at the time of the set operation, and at the time of the read operation in this order. In the vertical type chain memory in which the bit line side is connected to BL2, BL3, or BL4 and the word line side is connected to WL1, both voltages of the bit line and the word line are 4 V at the time of the reset operation, 3 V at the time of the set operation, and 2 V at the time of the read operation. As a result, current does not flow because the bit line and the word line have no voltage difference. In the vertical type chain memory in which the bit line side is connected to BL1 and the word line side is connected to WL2 or WL3, both voltages of the bit line and the word line are 0 V at the time of the reset operation, at the time of the set operation, and at the time of the read operation. As a result, current does not flow because the bit line and the word line have no voltage difference. In the vertical type chain memory in which the bit line side is connected to BL2, BL3, or BL4 and the word line side is connected to WL2 or WL3, 0 V and 4 V are biased to the word line and the bit line respectively at the time of the reset operation; 0 V and 3 V are biased to the word line and the bit line respectively at the time of the set operation, and 0 V and 2 V are biased to the word line and the bit line respectively at the time of the read operation. Voltages are biased in a reverse bias direction of the polysilicon diode PD that selects the vertical type chain memory. The memory cell array can be manufactured so that OFF current in a reverse bias direction of the polysilicon diode PD is sufficiently reduced. Therefore, only the vertical type chain memory in which the bit line side is connected to BL1 and the word line side is connected to WL1 can bias the forward bias to PD to flow current. As a result, SMC in the memory array can be selected and operated because SMC in the vertical type chain can selected and operated by the method described in FIG. 13.

Figure 15A:
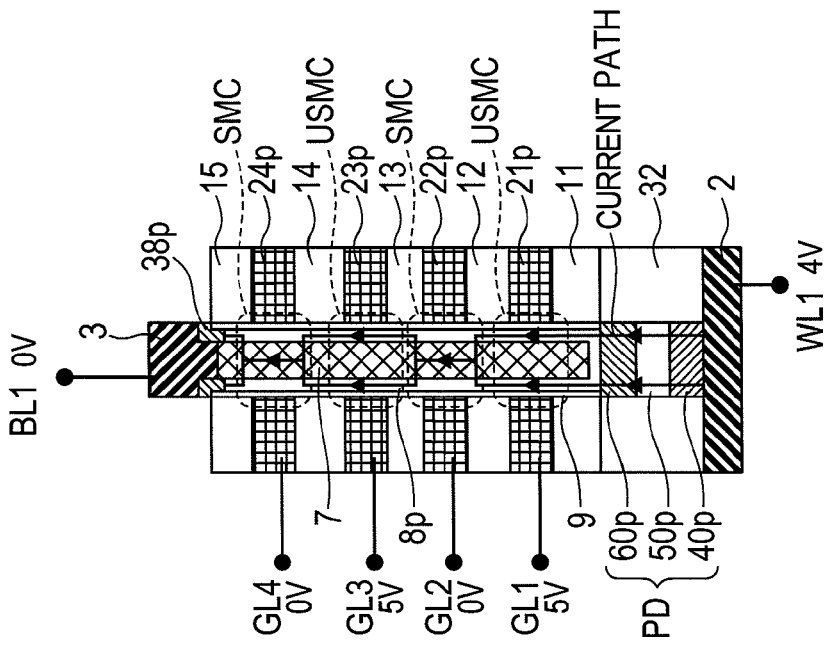
FIG. 15 are views illustrating the set operation performed before data programing to the semiconductor storage device in the first embodiment of this invention; (a) illustrates the simultaneous set operation to the first layer and the third layer in a selection chain; (b) illustrates the simultaneous set operation to the second layer and the fourth layer in the selection chain.
Figure 15B:
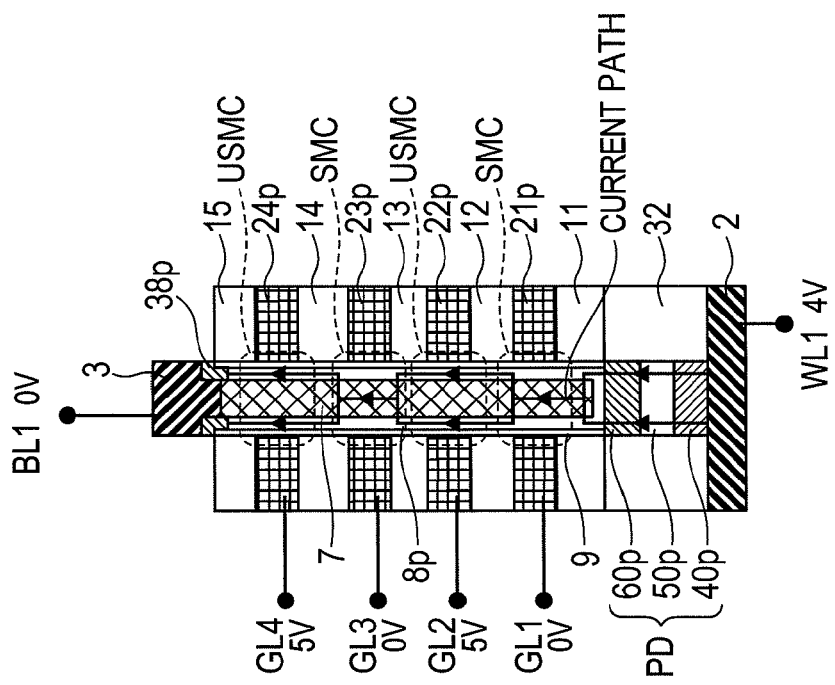
Figure 16:
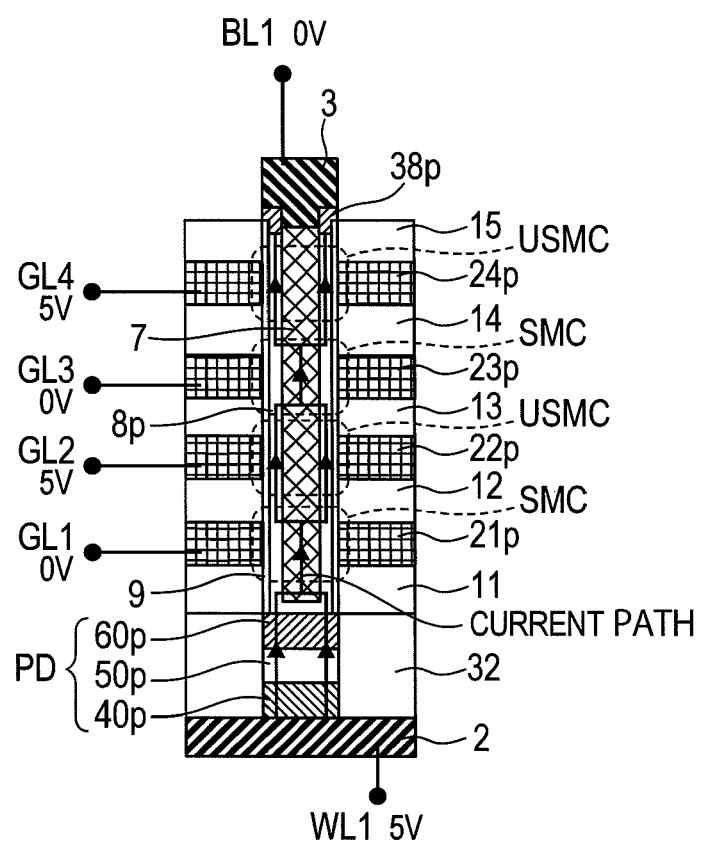
FIG. 16 is a view illustrating data programing by the reset operation to the semiconductor storage device in the first embodiment of this invention subsequently performed from the operation in FIG. 15.

A set operation and a reset operation of a memory cell that further reduces power consumption can be performed as follows. First, all cells in each chain memory is set to the set state when programing/erasing of the chain memory is performed. As a method in this case, for example, cells can be set to the set state one by one by the method illustrated in FIG. 13. It is also possible that a plurality of cells in the chain are simultaneously selected to perform the set operation as illustrated in FIGS. 15(a) and 15(b). Odd-numbered cells in the chain cell selected in the operation in FIG. 15(a) are selected and the reset operation is simultaneously performed at the same time, and even-numbered cells in the chain cell selected in the operation in FIG. 15(b) are selected and the reset operation is simultaneously performed. Thereby, all the cells can be set to the set state in a short time compared with the set operation being performed one by one. Required current is not increased compared with the case of performing the set operation to one cell because the serially connected cells are simultaneously selected to perform the set operation. In FIGS. 15(a) and 15(b), the set operation is separately performed to odd-numbered layers and even-numbered layers. However, the method for performing the set operation is not limited to this method. For example, a method for simultaneously performing the set operation to all layers and a method for sequentially performs the set operations every m layers (m≥2) from the lowest layers can be applicable. At the time of programing data, only reset operation is performed to cells depending on a data pattern. At this time, the reset operation is simultaneously performed to a plurality of cells in the chain as illustrated in FIG. 16. In FIG. 16, an example in which a first layer and a third layer are simultaneously selected is illustrated. In FIG. 16, 0 V is biased to a gate lines GL1, GL3 connected to a plurality of selected cells SMC, and a transistor determining the channel polysilicon layer 8p as a channel is set to the OFF state. 5 V is biased to gate lines GL2, GL4 connected to the selected cell SMC, and the transistor is set to the ON state. 0 V is biased to the bit line BL1, and required voltage for the reset operation, for example 5V, is biased to the word line WL1. In the gate polysilicon of the select transistor, 5 V is biased to a gate to which SMC is connected, that is, STGL1, and the transistor is set to the ON state. 0 V is biased to the gate to which SMC is not connected, that is, STGL2, and the transistor is set to the OFF state. In the unselected cell USMC1, in which the transistor is in the ON state, the channel has low resistance. The channel polysilicon layer 8p of STGL1, which is in the ON state, also has low resistance. Almost same current can be flown not depending on the state of the phase change material layer 7 in the USMC1 part. Current flows through the phase change material layer 7 because the transistor is in the OFF state in SMC. In SMC, the reset operation is performed by changing the resistivity of the phase change material 7 by current flown through the phase change material layer 7 using SMC. The transistors of the unselected cell USMC2 and the unselected cell USMC3 have common gate voltage with the transistors of SMC and USMC1, respectively. As a result, the transistor of USMC2 is in the OFF state and the transistor in USMC3 is in the ON state. Current passing through USMC2 and USMC3 is not flown, because the select transistor in which STGL2 is connected to the gate polysilicon layer 61p is in the OFF state. Therefore, only in SMC, current flows through the phase change material layer 7, and the selective operation is possible. Thereby, data programing throughput can be increased because a plurality of cells can be programed in one operation. Required current is the same as the case of the reset operation for one cell even when the reset operation for a plurality of cells in a chain is performed, because serially connected cells are simultaneously selected. As a result, the data programing throughput per power consumption also can be increased. Depending on programed data, the case when the reset operation to the cells in the chain is not performed or the case when the reset operation to only one cell in the chain is performed exists. In the case of the data for which the reset operation is performed to only one cell, the operation in FIG. 13 is performed.

Similar to FIGS. 9 and 10, similar effect also can be obtained by firstly setting all cells in each chain memory in the reset state when data programing/erasing in the chain memory is performed, and performing the set operation to a plurality of cells in the chain at the time of data programing.

In any of FIGS. 1 to 16, the vertical chain cells are described. However, the method in the first embodiment of this invention can perform faster programing/erasing by applying the method to any structures of a vertical type and a horizontal type as long as the chain cell is a chain type phase change memory. For example, the method can be applied to the chain cell described in Patent Literature 1.

At the time of the set operation and the reset operation, current also flows through an unselected cell in the same chain as the selected cell SMC to generate Joule heat. The generated Joule heat causes disturbance to the unselected cell and may cause programing error. A rate of programing error is increased in accordance with the number of the disturbances. In the set operation and the reset operation in this embodiment, all the cells are once set to the set state or the reset state before programing data, and thereafter, programing is simultaneously performed to a plurality of cells. Therefore, the number of disturbances to the unselected cell in which data is previously programed can be reduced compared with a conventional method.

It is described that voltages at the time of the reset operation, at the time of the set operation, and at the time of the read operation is 4/3/2 V in the example of the conventional method and 5/4/2 V in the first embodiment of this invention. However, although voltage is increased at the time of the reset operation, at the time of the set operation, and at the time of the read operation in this order, the required voltage for the operation is varied depending on a circuit element used, and is not limited to these voltages.

Effect of the first embodiment of this invention is illustrated in FIGS. 17(a) and 17(b). Compared with the conventional programing/erasing method, a programing/erasing rate per unit time and a programing/erasing rate per power consumption can be increased because a plurality of cells can be collectively programed/erased without increase in power consumption. The number of disturbances to the unselected cell at the time of the set operation and the reset operation and the rate of programing error can be decreased.

Second Embodiment

In the first embodiment, the operation for setting all cells in the chain cell in the set state or the operation for setting all cells in the chain cell in the reset state is separately performed for each chain. In the second embodiment of this invention, an example of an operation for simultaneously setting all chain cells adjacent to each other in the set state or the operation for simultaneously setting all chain cells adjacent to each other in the reset state is described.

Figure 18A:
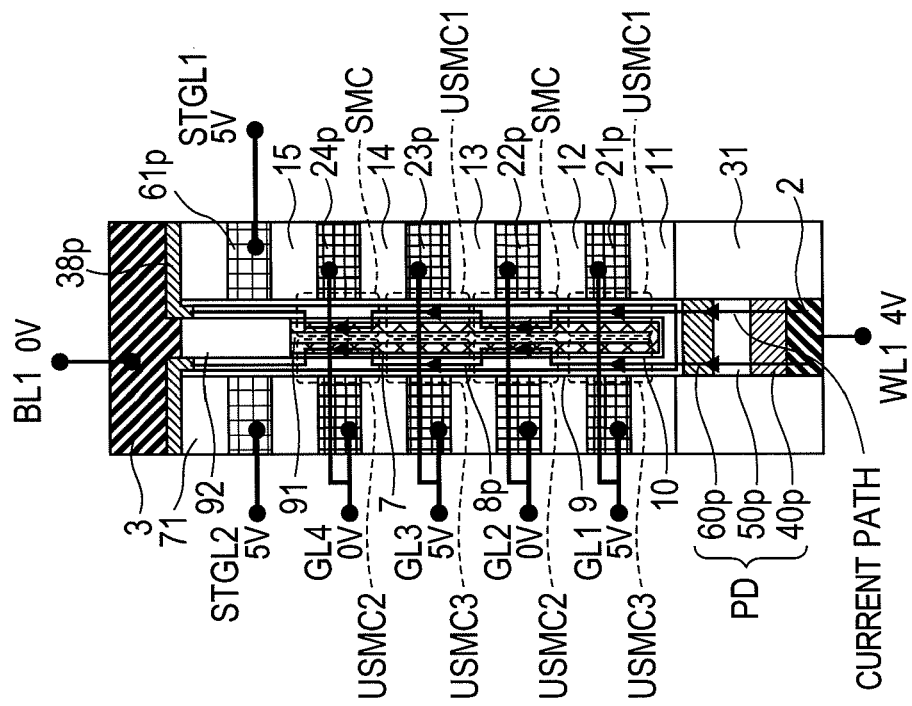
FIG. 18 is a view illustrating a set operation in a second embodiment of this invention.
Figure 18B:
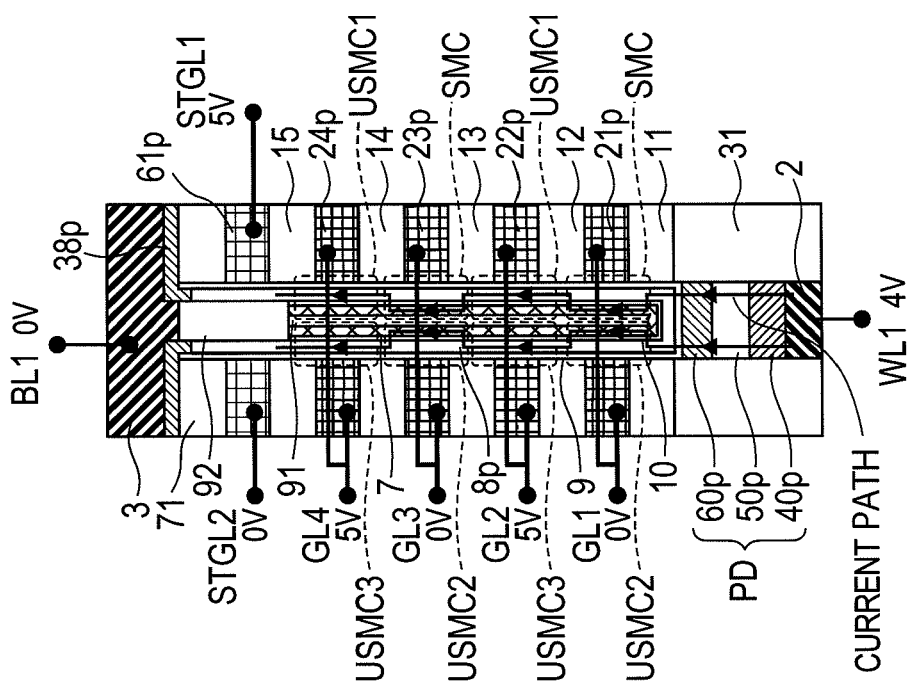

In FIGS. 18(a) and 18(b), a method for setting all cells in the chain cell to the set state in the second embodiment in this invention is illustrated. Odd-numbered cells in the chain cell adjacent to each other are selected in the operation in FIG. 18(a) and the set operation is simultaneously performed, and even-numbered cells in the chain cell adjacent to each other are selected in the operation in FIG. 18(b) and the set operation is simultaneously performed. Compared with FIGS. 7(a) and 7(b), it is different in that the voltage of the wire STGL2 for supplying electricity to the select transistor is 5 V being the ON voltage. The term "adjacent" here means a relation of two wires having equivalent distance to the semiconductor substrate (not illustrated) and having the nearest distance. As an actual device, two wires having the nearest position in the wires formed in the same polysilicon layers ($21p$, $22p$, $23p$, $24p$, and $61p$) are referred to as "adjacent" to each other.

As illustrated in FIG. 4, programing/erasing of the phase change memory for both of the set operation and the reset operation is performed by Joule heat generated by the current flowing through the phase change material. The Joule heat generated at the time of the programing/erasing is also conducted to surrounding memory cells through the interpoly dielectric film 91, an interface layer 10, the channel polysilicon $8p$, the gate polysilicons $21p$, $22p$, $23p$, $24p$, and the gate insulator film 9 surrounding the phase change material. As illustrated in FIGS. 18(a) and 18(b), the set operation is simultaneously performed by using Joule heat generated in the set operation of the adjacent chain cells, and thereby each chain cell can be heated to a temperature required for the set operation even when the current flowing through each chain cell is less than the current separately performing the set operation to the chain cells. In addition, a throughput of the set operation per unit time can be increased because the set operation is simultaneously performed to a plurality of chain cells.

As described above, in the invention according to this embodiment, when all memory elements (N elements) included in the first chain cell are set, all memory elements (N elements) included in the second chain cell connected to the same word line as the first chain cell are set. At this time, adjacent memory elements between the first chain cell and the second chain cell are simultaneously set. The term "adjacent" here in relation to the memory element means a relation of two elements having equivalent distance to the semiconductor substrate and having the nearest position.

In FIGS. 18(a) and 18(b), the set operation is separately performed to odd-numbered layers and even-numbered layers. However, the method for performing the set operation is not limited to this method. For example, a method for simultaneously performing the set operation to all layers and a method for sequentially performs the set operations every m layers (m≥2) from the lowest layers can be applicable.

In FIGS. 18(a) and 18(b), the set operation is simultaneously performed to adjacent chain cells at the time of setting all cells in the chain cell to the set state. Also, it is obviously possible that the reset operation is simultaneously performed to adjacent chain cells at the time of setting all cells in the chain cell to the reset state. In this case, the set operation is simultaneously performed by using Joule heat generated in the set operation of the adjacent chain cells, and thereby each chain cell can be heated to a temperature required for the reset operation even when the current flowing through each chain cell is less than the current separately performing the reset operation to the chain cells. In addition, a throughput of the set operation per unit time can be increased because the reset operation is simultaneously performed to a plurality of chain cells.

In the example of FIGS. 18(a) and 18(b), the example in which the set operation is simultaneously performed to two vertical type chain memories existing at one intersection point of the bit line and the word line is described. Also as illustrated in FIG. 19, the vertical chains existing at a plurality of intersection points can be simultaneously selected and the set operation can be performed.

Figure 19:
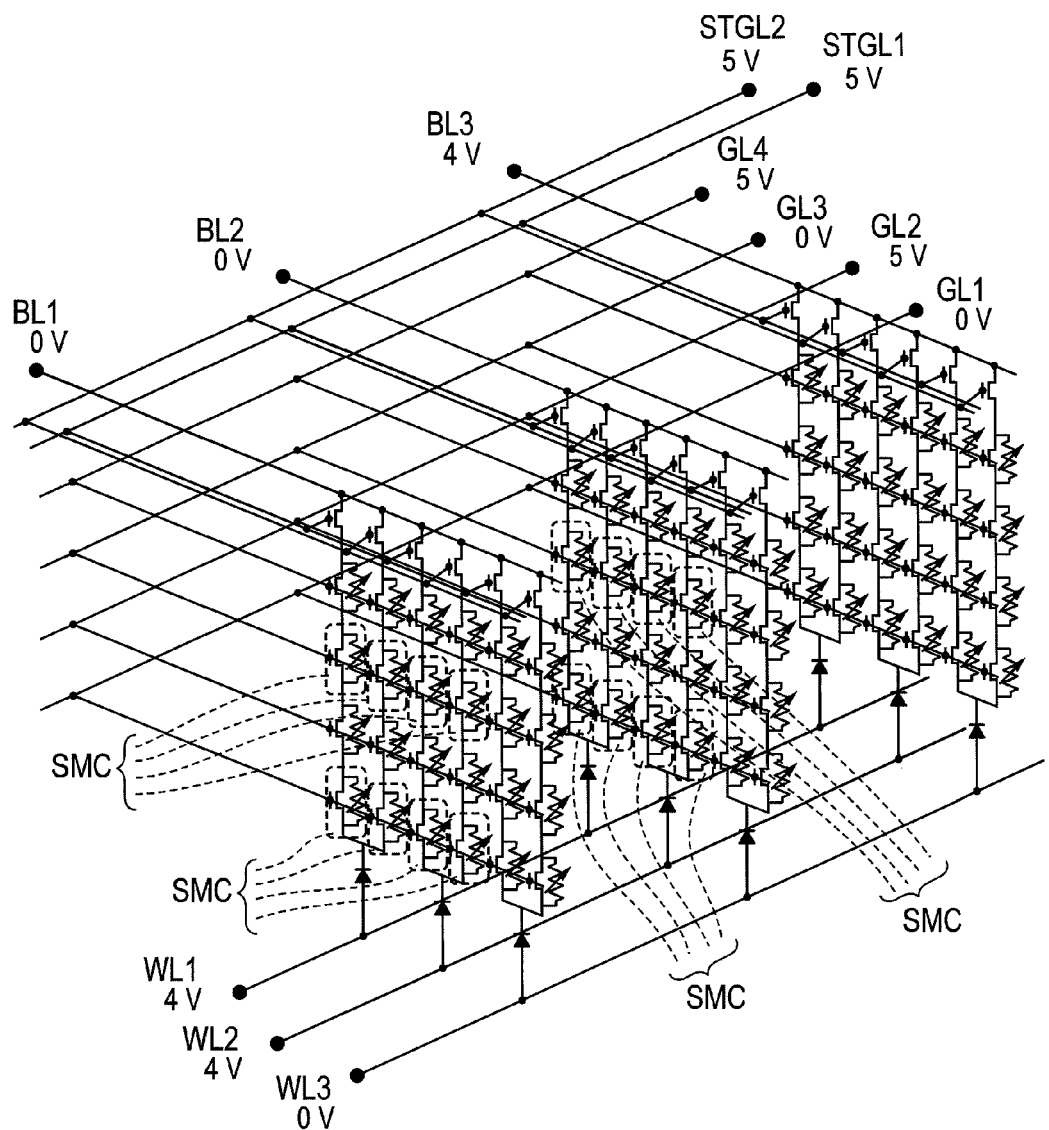
FIG. 19 is a view illustrating the set operation in the second embodiment of this invention.

In an example in FIG. 19, the example in which WL1 and WL2 are selected word lines and BL1 and BL2 are selected bit lines is illustrated. Each two vertical type chains at four intersection points, that is, eight vertical type chains are simultaneously selected and the set operation is simultaneously performed to odd-numbered layers. Similarly, it is also possible, that the set operation being simultaneously performed to even-numbered layers as described above.

In the example of FIGS. 18(a) and 18(b) and FIG. 19, the example in which two vertical type chain memories are independently operated at the intersection point of the bit line and the word line is described. As illustrated in FIGS. 11 and 12, a similar operation also can be performed in the case that one chain memory is formed at the intersection point of the bit line and the word line.

The method for simultaneously performing the set operation to the adjacent cells or simultaneously performing the reset operation to the adjacent cells is applicable for not only the vertical type chain cell but also the horizontal type chain cell. As a result, faster programing/erasing can be achieved by the simultaneous set operation and the simultaneous reset operation. This method is not only applicable to the vertical type chain cell and the horizontal type chain cell, but also applicable to a general phase change memory including a plurality of memory cells. One example is illustrated in FIGS. 20 to 23.

Figure 20:
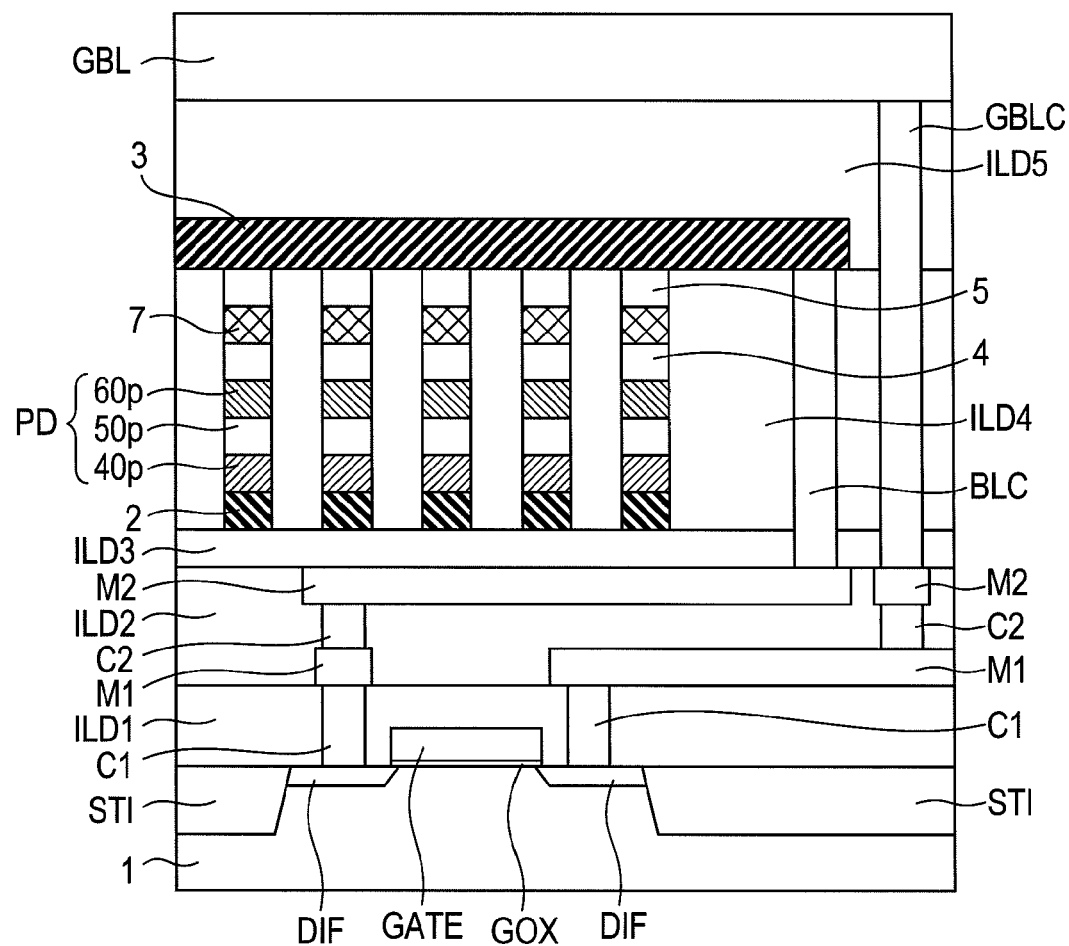
FIG. 20 is a partial cross-sectional view of a semiconductor storage device in the second embodiment of this invention.

FIG. 20 is a partial cross-sectional view of a semiconductor storage device in the second embodiment of this invention, and parts of a memory cell array, wires, and contacts are illustrated. A part constituted by element isolation grooves STI, a gate GATE of a transistor, a gate insulator film GOX, diffusion layers DIF, interpoly dielectric films ILD1, ILD2, ILD3, ILD4, ILD5, wire layers M1, M2, contact holes C1 connecting a device on the semiconductor substrate and M1, contact holes C2 connecting M1 and M2, word lines 2 made of metal wires, polysilicon diodes PD made of polysilicon layers $40p$ being doped with a p-type impurity, polysilicon layers $50p$ being doped with a low concentration impurity, and polysilicon layers $60p$ being doped with an n-type impurity, a bit lines 3 made of electrode materials 4,5 a phase change materials 7, and metal wires, a contact hole BLC connecting the bit line 3 and a circuit formed on the semiconductor substrate 1, and a contact hole GBLC connecting a global bit line GBL and the metal wire layer M2 lying under the global bit line formed on a semiconductor substrate 1 is illustrated in FIG. 20.

Figure 21:
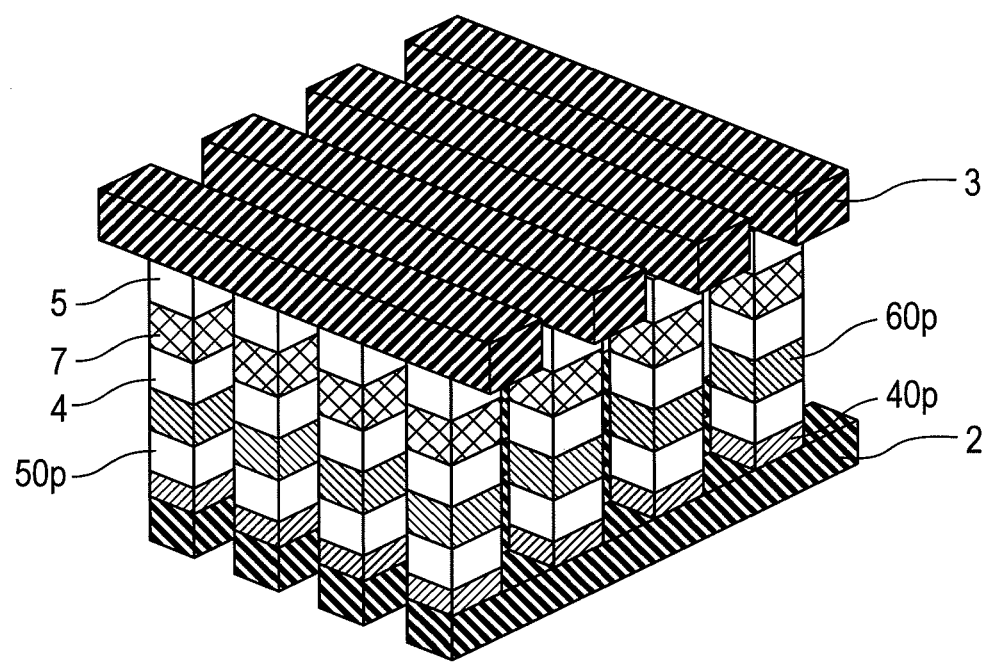
FIG. 21 is a partial three dimensional schematic view of the semiconductor storage device in the second embodiment of this invention.

FIG. 21 is a partial three dimensional schematic view of the semiconductor storage device in the second embodiment. The view illustrates a part of the memory cell array. A part constituted by the word lines 2 made of metal wires, the polysilicon diodes PD made of the polysilicon layers $40p$ in which a p-type impurity is doped, the polysilicon layers $50p$ in which a low concentration impurity is doped and the polysilicon layers $60p$ in which an n-type impurity is doped, and bit lines 3 made of the electrodes 4, the phase change material layers 7, the electrodes 5, and metal wires formed on PD and formed in a stripe shape in a direction perpendicular to the word line is illustrated in FIG. 21. Although not illustrated, each of the word lines 2 and the bit lines 3 in FIG. 20 is connected to a circuit on the semiconductor substrate. As a result, voltage can be individually biased.

Similar to the chain cell in FIGS. 1 to 19, the semiconductor storage device of the second embodiment memorizes information by using a phenomenon in which phase change materials such as $Ge_2Sb_2Te_5$ included in the phase change material layer 7 has different resistivities in an amorphous state and a crystal state. The phase change memory has higher resistance in the amorphous state and has lower resistance in the crystal state. Therefore, read is performed by biasing voltage difference across the variable resistance type element, measuring current flown through the element, and determining whether the resistance state of the element is high or low.

The memory cell array in FIGS. 20 and 21 is constituted by memory cells made of a plurality of bit lines 3 and word lines 2, and the memory cells made of the electrodes 4 and 5, phase change elements 7, and the and polysilicon diodes PD and located intersection points of the bit lines 3 and the word lines 2.

Figure 22:
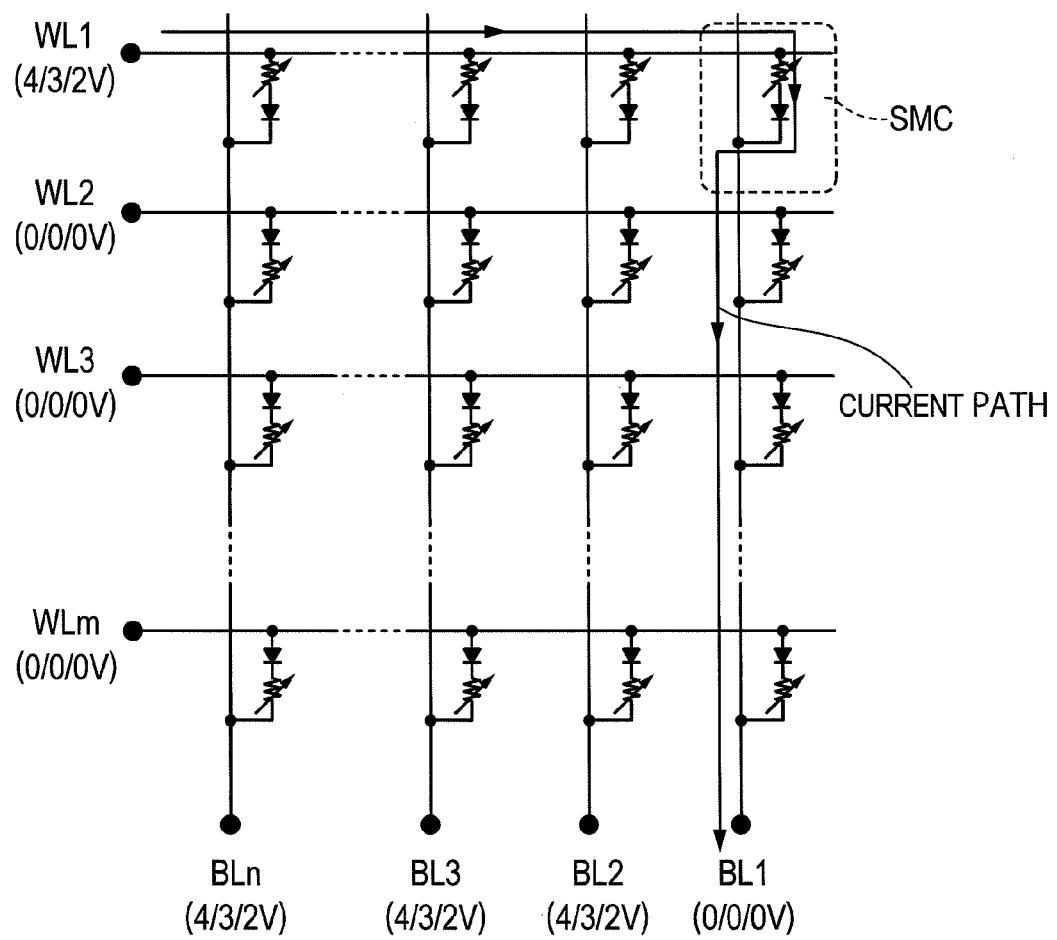
FIG. 22 is a view illustrating a conventional example of a reset operation, a set operation and a read operation of the memory cell array in FIGS. 20 and 21.

In FIG. 22, relations of voltages among the bit lines BL1, BL2, BL3, and BLn, and the word lines WL1, WL2, WL3, WLm at the time of performing the reset operation, the set operation and the read operation are illustrated. The selected cell SMC is determined as a cell existing at the intersection point of the bit line BL1 and the word line WL1. Voltages of WL1, that is, 4/3/2 V, are voltages at the time of the reset operation, at the time of the set operation, and at the time of the read operation, respectively. Similarly, notations of voltages of other terminals in FIG. 22 represent voltages at the time of the reset operation, at the time of the set operation and at the time of the read operation in this order. In the memory cell in which the bit line side is connected to BL2, BL3, or BL4 and the word line side is connected to WL1, both voltages of the bit line and the word line are 4 V at the time of the reset operation, 3 V at the time of the set operation, and 2 V at the time of the read operation. As a result, current does not flow because the bit line and the word line have no voltage difference. In the memory cell in which the bit line side is connected to BL1 and the word line side is connected to WL2 or WL3, both voltages of the bit line and the word line are 0 V at the time of the reset operation, at the time of the set operation, and at the time of the read operation. As a result, current does not flow because the bit line and the word line have no voltage difference. In the memory cell in which the bit line side is connected to BL2, BL3 or BL4 and the word line side is connected to WL2 or WL3, 0 V and 4 V are biased to the word line and the bit line respectively at the time of the reset operation; 0 V and 3 V are biased to the word line and the bit line respectively at the time of the set operation; and 0 V and 2 V are biased to the word line and the bit line respectively at the time of the read operation. Voltages are biased in a reverse bias direction of the polysilicon diode PD that selects the memory cell. The memory cell array can be manufactured so that OFF current in a reverse bias direction of the polysilicon diode PD is sufficiently reduced. Only the memory cell in which the bit line side is connected to BL1 and the word line side is connected to WL1 can bias the forward bias to PD to flow current. As a result, SMC in the memory array can be selected and operated.

Figure 23:
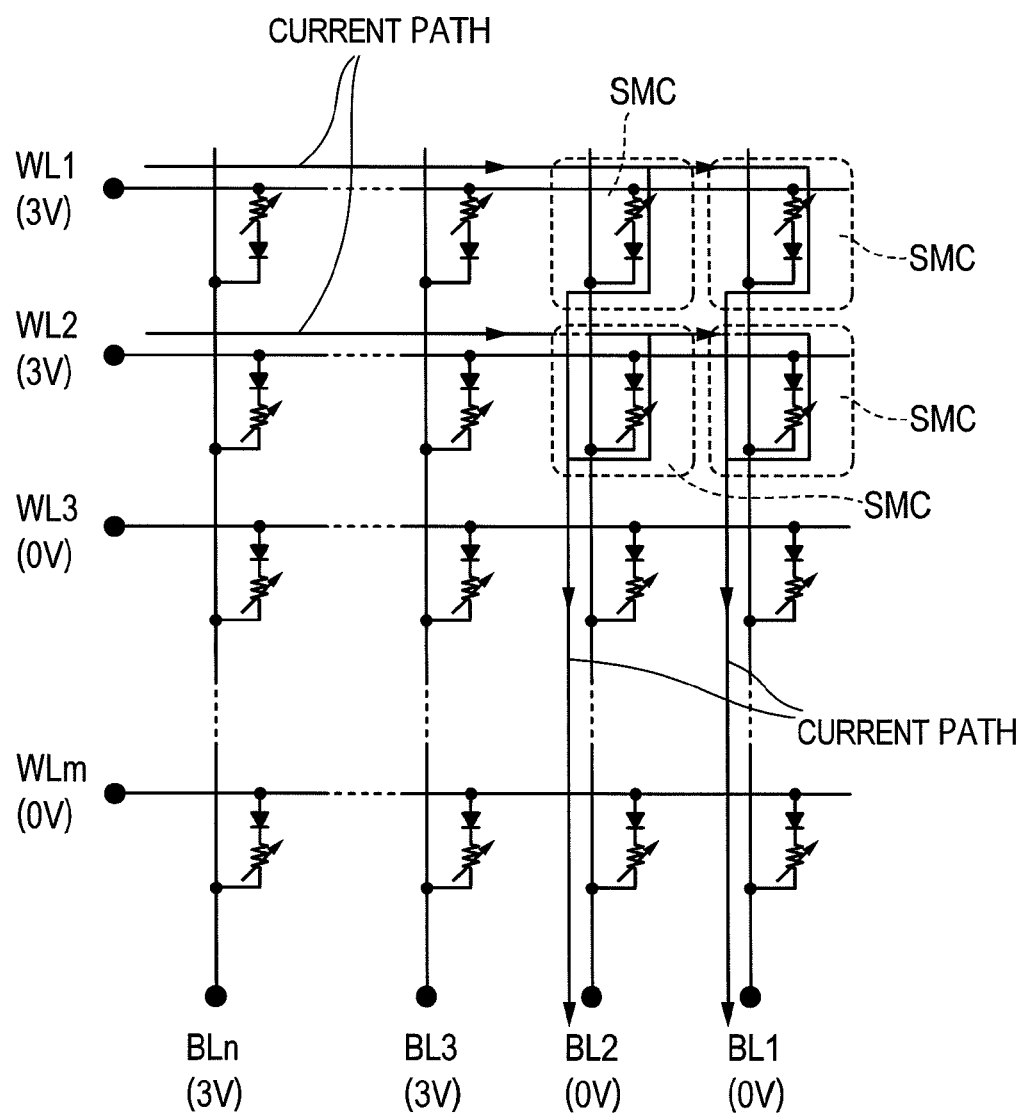
FIG. 23 is a view illustrating the set operation in the second embodiment of this invention.

To the memory cell in FIGS. 20 and 21, the set operation is simultaneously performed to adjacent cells as illustrated in FIG. 23, and thereby power consumption per cell required for the set operation can be reduced and a throughput of the set operation per unit time can be increased. In FIG. 23, the set operation is simultaneously performed to the adjacent cells. Also, it is obviously possible that the reset operation is simultaneously performed to the adjacent cells. In this case, the reset operation is simultaneously performed by using Joule heat generated in the reset operation of the adjacent cells, and thereby power consumption per cell required for the set operation can be reduced and a throughput of the set operation per unit time can be increased.

In the method in the second embodiment of this invention, compared with conventional programing/erasing method, the set operation or the reset operation can be simultaneously performed using less power consumption per cell by using each other's Joule heat. Therefore, similar to the first embodiment, a programing/erasing speed per unit time and a programing/erasing speed per power consumption can be increased.

Third Embodiment

In the first and second embodiments, the programing/erasing of the phase change memory is performed by the Joule heat generated by the current flowing through the phase change material. As illustrated in this third embodiment, in the chain cell in which the channel of the transistor and the phase change material are close to each other as illustrated in FIGS. 1 to 3 and FIGS. 11 and 12, the set operation of the phase change memory can be performed by using the Joule heat generated by the current flowing through the channel of the transistor.

Figure 24:
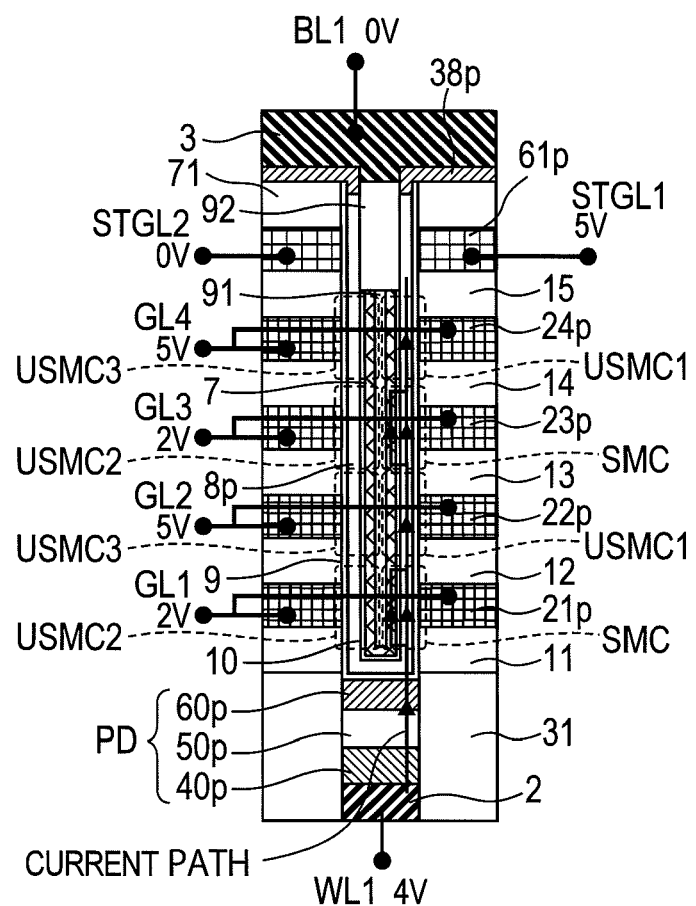
FIG. 24 is a view illustrating a set operation in a third embodiment of this invention.

In FIG. 24, an example that the set operation is performed by using heat generated by the channel current of the transistor in the cell in which two vertical type chain memories are independently operated at the intersection point of the bit line and the word line whose structure is illustrated in FIGS. 1 to 3 is illustrated.

Gate voltage of the unselected cell SMC is set to a value of voltage being slightly higher than the OFF voltage of the transistor and being lower than the voltage that completely sets the channel to the ON state so as to be used for gate voltage of the transistor of the unselected cell. Here, the gate voltage is set to 2 V. In the selected cell SMC, more current is flown through the channel than the phase change element because the channel of the transistor has higher resistance than that of the channel of the unselected cell and lower resistance than that of the phase change element of SMC. Therefore, Joule heat is selectively generated in the channel of SMC. The set operation of the phase change element of the SMC is performed by the Joule heat generated in the channel of SMC.

This set operation can be performed by selecting one cell in the chain or by simultaneously selecting a plurality of cells. A similar set operation can be performed when one chain memory is formed at one of the intersection points of the bit lines and the word lines as illustrated in FIGS. 11 and 12.

In the conventional method in which the set operation is performed by the Joule heat generated by flowing current through the phase change material, high voltage is required in order to generate sufficient Joule heat for crystallization caused by flowing current to the element at the time of the set operation, if element resistance in the reset state before performing the set operation rarely becomes too high. If the resistance becomes too high, sufficient high voltage cannot be generated, and thereby, the set operation may not be performed.

A semiconductor storage device that can stably perform the set operation even when the resistance in the reset state is high can be provided by the method in the third embodiment of this invention in which the channel current of the transistor adjacent to the phase change material and the Joule heat generated by the channel current is controlled by the gate voltage and thereby temperature rise required for the set operation is performed.

Fourth Embodiment

In the second embodiment, the throughput in which all cells in the chain are set to the set state or the reset state is increased by simultaneously performing the set operation or the reset operation in the adjacent chain cells. At the time of subsequent data programing, Joule heat generated in the adjacent chain cell may cause programing error. In the fourth embodiment, the number of disturbances from the adjacent chain cell is reduced by determining the sequence of programing to the chain cell, and thereby, a rate of programing error generation is reduced.

Figure 25:
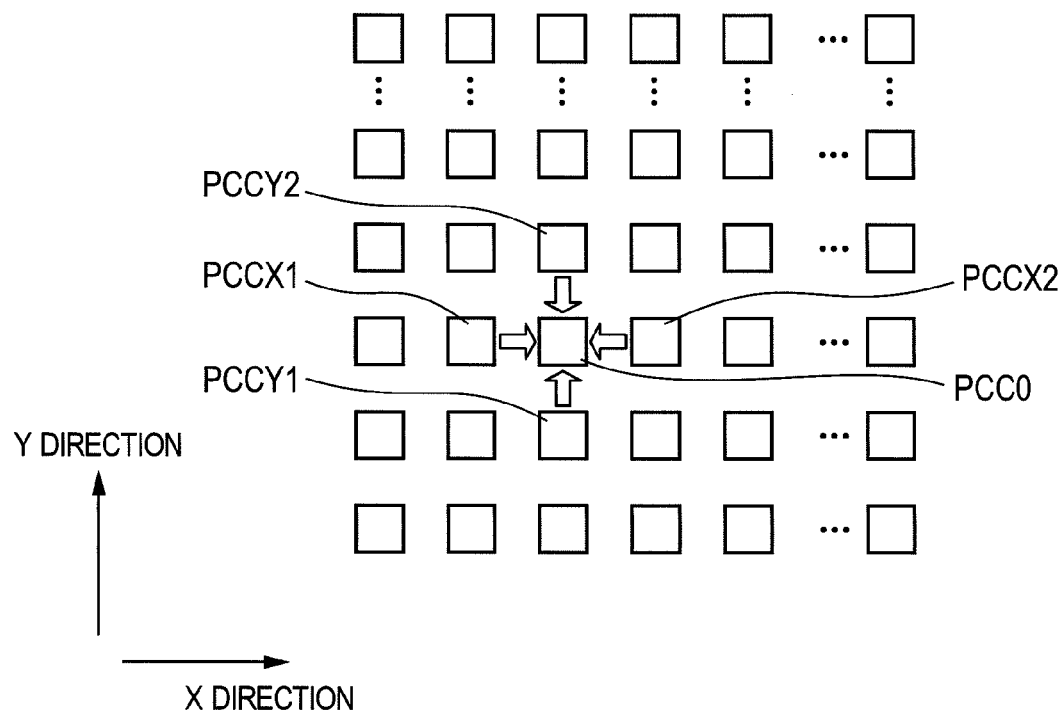
FIG. 25 is a view illustrating an operation and disturbance in a conventional method.

FIG. 25 illustrates a conventional programing/erasing method and the number of disturbances. After completion of data programing to a chain cell PCC0 receiving the disturbance, programing/erasing to adjacent chain cells PCCX1 and PCCX2 is performed without limitation. When the member of programmable/erasable times to the phase change memory is determined as n times, programing/erasing of each of four chain cells of PCCX1, PCCX2, PCCY1, PCCY2 is performed n times in the worst case. As a result, the number of disturbances becomes 4n times in total. In the case of the phase change memory, the value of n may be more than one million and the number of the disturbances becomes more than four million times. The rate of the programing error caused by the disturbance becomes high, and reliability is decreased.

Figure 26A:
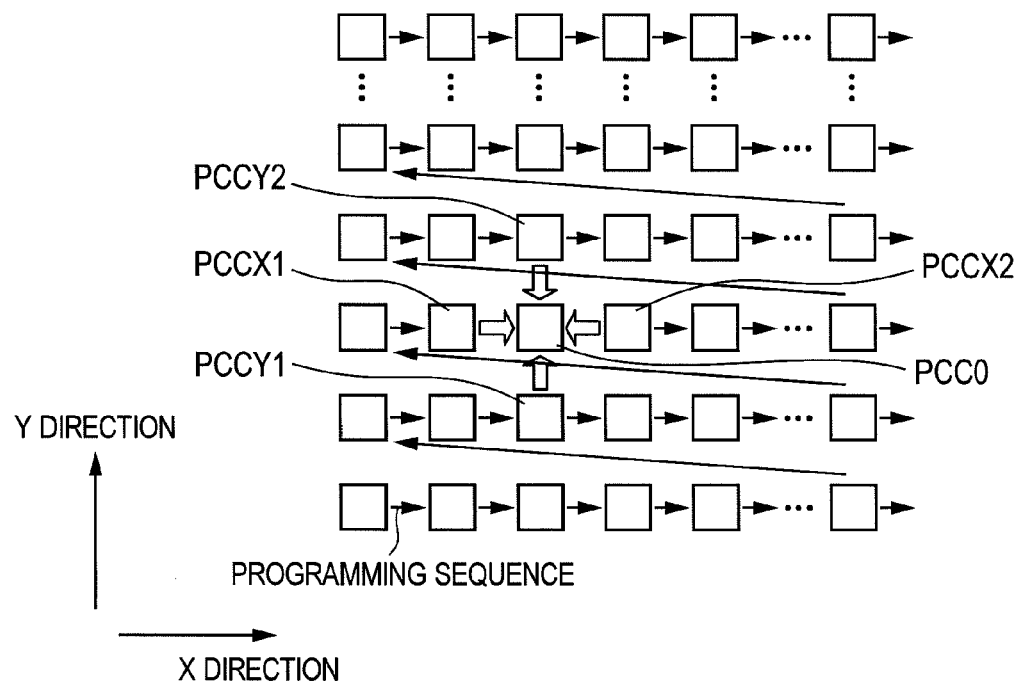
FIG. 26 are views illustrating programing/erasing operation in a fourth embodiment of this invention; (a) illustrates the case that collective set operation for all chain cells in an array is not performed before data programing; (b) illustrates the case that collective set operation for all chain cell in the array is performed before data programing.
Figure 26B:
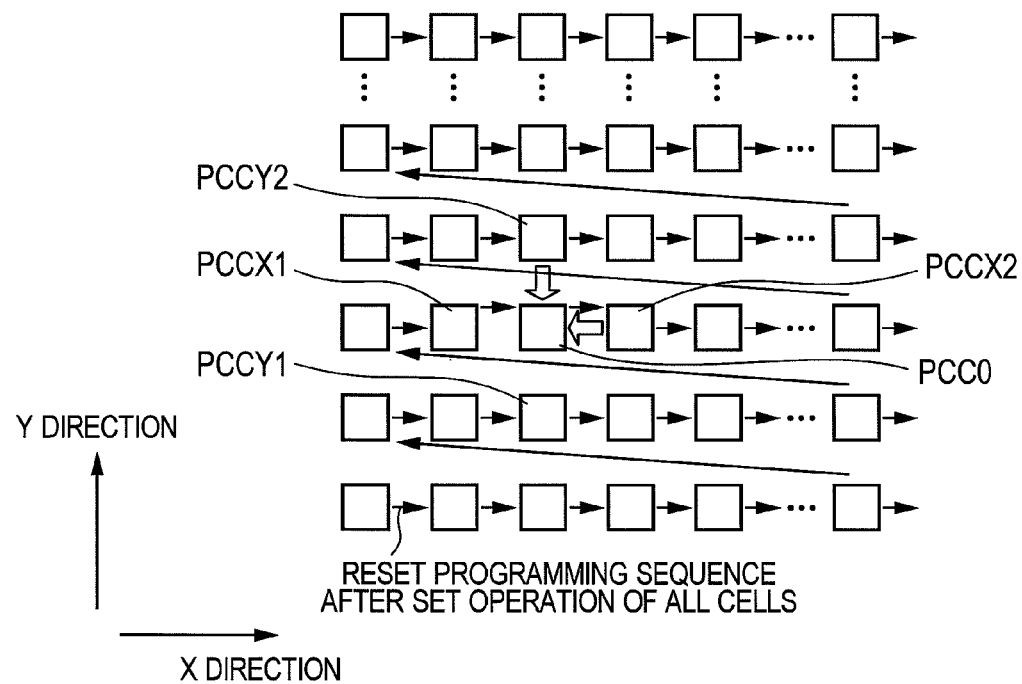

FIGS. 26(a) and 26(b) illustrates a method for assigning the data programing to the chain cell in a semiconductor storage device in the fourth embodiment in this invention. While programing to the chain cell has been randomly performed in a conventional method, programing is sequentially performed from the position of smaller coordination value in an X direction and a Y direction in FIG. 26(a). First, the programing is performed to a direction of larger coordination value in the X direction, and then the programing is performed to a direction of larger coordination value in the Y direction. By determining the sequence of the programing as described above, the maximum times of disturbance after completion of the data programing in the chain cell can be reduced to 4 times in total, that is, one time by one time from adjacent chain cells in the X direction and the Y direction.

Further, the maximum times of disturbance from the noticed chain cell can be reduced to 2 times in total, that is, one time by one time from the chain cells each having a larger coordination values in the X direction and the Y direction as illustrated in FIG. 26(b) by performing the data programing by the reset operation after all chain cells adjacent in the X direction and the Y direction are once set to the set state.

Figure 27:
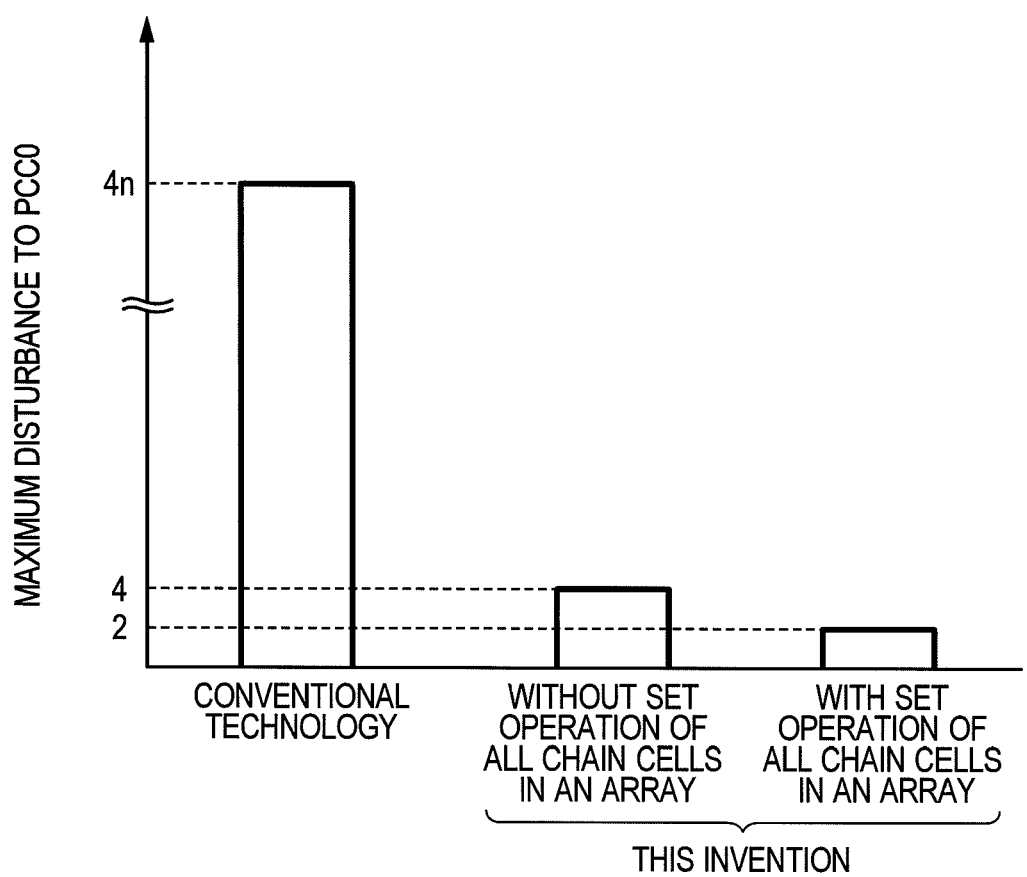
FIG. 27 is a graph illustrating an effect in the fourth embodiment of this invention.

Reduction in the number of the disturbances by assigning the sequence of programing has the effect used in phase change memories other than the chain cell. Similar effect can be obtained in a manner that, in the cell of the phase change memory in FIGS. 20 and 21, in sequence from smaller coordination values in the X direction and the Y direction, first, programing is performed from the cell having smaller coordination values in the X direction, and then programing is sequentially performed from the cell having smaller coordination values in the Y direction. The effect of the semiconductor storage device in the fourth embodiment of this invention described above is illustrated in FIG. 27.

REFERENCE SIGNS LIST

1 Semiconductor Substrate
2 Word Line
3 Bit Line
4, 5 Electrode
40p P-type Impurity Doped Polysilicon Layer
50p Low Concentration Impurity Doped Polysilicon Layer
60p N-type Impurity Doped Polysilicon Layer
7 Phase Change Material Layer
8p Channel Polysilicon Layer
9 Gate Insulator Film Layer
10 Insulator Film Layer
11, 12, 13, 14, 15 Insulator Film Layer
21p, 22p, 23p, 24p Gate Polysilicon Layer
31, 32 Insulator Film Layer
38p N-type Impurity Doped Polysilicon Layer
61p Polysilicon Layer
71 Insulator Film Layer
91, 92 Insulator Film Layer
ILD1, ILD2, ILD3, ILD4, ILD5, ILD6 Interpoly Dielectric Film
M1, M2 Metal Wire Layer
C1 Contact Connecting Metal Wire and Device on Semiconductor Substrate
C2 Contact Connecting between Metal Wires
STI Element Isolation on Semiconductor Substrate
DIF Diffusion Layer on Semiconductor Substrate
GATE Gate of Transistor
GOX Gate Insulator Film
GBL Global Bit Line
GBLC Contact connecting Global Bit Line and Underlying Metal Wire
MA Memory Array
BL, BL1, BL2, BL3, BL4, BLn Bit Line WL, WL1, WL2, WL3, WLm Word Line
BLC Bit Line Contact
WLC Word Line Contact
GC1, GC2, GC3, GC4 Contact to Gate Electrode
GL1, GL2, GL3, GL4 Metal Wire for Supplying Electricity to Gate Electrode
GLC1, GLC2, GLC3, GLC4 Contact between Metal Wire and Peripheral Circuit
STGC1, STGC2 Contact to Select Transistor Gate
STGL1, STGL2 Metal Wire for Supplying. Electricity to Select Transistor
SMC Selected Memory Cell
USMC, USMC1, USMC2, USMC3 Unselected Memory Cell
PD Polysilicon Diode
PCC0 Chain Cell Receiving Disturbance
PCCX1 Chain Adjacent Cell to Chain Cell Receiving Disturbance in X direction
PCCX2 Chain Adjacent Cell to Chain Cell Receiving Disturbance in X direction
PCCY1 Chain Adjacent Cell to Chain Cell Receiving Disturbance in Y direction
PCCY2 Chain Adjacent Cell to Chain Cell Receiving Disturbance in Y direction

The invention claimed is:

1. A semiconductor storage device comprising:
a first word line;
a first bit line; and
N first memory cells (N is an integer of 3 or more) each comprising
a first memory element in which memory information is programed by current; and
a first transistor in which a source-drain path of the first transistor is connected in parallel to the first memory element, and provided between the first word line and the first bit line;

wherein each of the N first memory elements is serially connected to each other;

a resistivity of the first transistor is lower than that of the first memory element in a first state and higher than that of the first memory element in a second state; and in a state in which a first value is memorized in all of the N first memory elements, a control in which M first transistors (M is an integer 2 or more and less than N) in the N transistors are set to the second state, and remaining (N-M) transistors are set to the first state, and a first voltage difference is biased for memorizing a second value that is different from the first value to the M first memory elements is performed.

2. The semiconductor storage device according to claim 1, wherein, at the time of memorizing the first value to all of the N first memory elements, the first value is memorized to odd-numbered first memory elements in the N first memory elements, and thereafter, the first value is memorized to even-numbered first memory elements in the N first memory elements.

3. The semiconductor storage device according to claim 1, wherein, at the time of setting the M first transistors to the second state, all of the M first transistors are set to the first state, and thereafter, odd-numbered first transistors in the M first transistors are set to the second state, and thereafter, even-numbered first transistors in the M first transistors are set to the second state.

4. The semiconductor storage device according to claim 1, wherein each of the N first memory elements is constituted as a part of a continuous recording layer; and each channel layer in the N first transistors is constituted as a part of a continuous semiconductor film.

5. The semiconductor storage device according to claim 1, wherein a resistivity of the first memory element in a state of memorizing the second value is higher than a resistivity of the first memory element memorizing the first value.

6. The semiconductor storage device according to claim 5, wherein each of the first memory elements comprises a phase change element;

the phase change element is in a crystal state when the first memory element memorizes the first value and in an amorphous state when the first memory element memorizes the second value.

7. The semiconductor storage device according to claim 1, wherein the first state is in an ON state of the first transistor; and the second state is in an OFF state of the first transistor.

8. The semiconductor storage device according to claim 1, wherein the first state is in an ON state of the first transistor; and a voltage of a gate electrode is an intermediate voltage between the ON state and the OFF state in the first transistor in the second state.

9. The semiconductor storage device according to claim 1, further comprising:

a second bit line extending in parallel with the first bit line;

N second memory cells each comprises a second memory element in which memory information is programed by current, and a second transistor in which a source-drain path of the second transistor is connected in parallel to the second memory element, and provided between the first word line and the second bit line;

wherein each of the N second memory elements is serially connected to each other;

a resistivity of the second transistor is lower than that of the second memory element in the first state and higher than that of the second memory element in a second state; and at the time of memorizing the first value to all of the N first memory elements, a control for memorizing the second value to all of the N second memory elements is performed.

10. A semiconductor storage device comprising:

a first selected line provided over a semiconductor substrate;

a second selected line provided over the first selected line;

N first semiconductor layers (N is an integer of 3 or more) stacked through insulator films over the semiconductor substrate;

a first gate insulator film layer provided along the side surfaces of the N first semiconductors;

a first channel layer provided along the side in the side surfaces of the first gate insulator film layers where the first semiconductor layers are not provided, and electrically connected to the first selected line and the second selected line; and a first variable resistance material layer provided along the side in the side surfaces of the first channel layer where the first gate insulator film layers are not provided, electrically connected to the first selected line and the second selected line, and comprising a material that varies a resistivity by flown current, wherein, when a resistivity of the first channel layer is compared with a resistivity of apart of the first variable resistance material, layer adjacent to the first semiconductor layer, the resistivity of the first channel layer side is lower than a resistivity of the first variable resistance, material layer side when a first voltage is biased to the adjacent first semiconductor layer, and the resistivity of the first channel layer side is higher than the resistivity of the first variable resistance material layer side when a second voltage is biased to the adjacent first semiconductor layer; and in a state in which a resistivity of a part of the first variable resistance material layer adjacent to the N first semiconductor layers is a first resistivity, a control in which the second voltage is biased to M first semiconductor layers (M is an integer of 2 or more and less than N) in the N first semiconductor layers, and the first voltage is biased to remaining (N−M) first semiconductor layers, and thereafter, a third voltage difference changing the resistivity in a part of the first variable resistance material layer adjacent to the first semiconductor layer to which the second voltage is biased to a second resistivity is biased between the first selected line and the second selected line is performed.

11. The semiconductor storage device according to claim 10, wherein, at the time of setting the resistivity of a part of the first variable resistance material layer adjacent to the N first semiconductor layers to the first resistivity, a resistivity of a part of the first variable resistance material layer adjacent to odd-numbered first semiconductor layers in the N first semiconductor layers is set to the first resistivity, and thereafter, a resistivity of a part of the first variable resistance material layer adjacent to even-numbered first semiconductor layers in the N first semiconductor layers is set to the first resistivity.

12. The semiconductor storage device according to claim 10, wherein, at the time of biasing the second voltage to the M first semiconductor layers, the first voltage is biased to all of the M first semiconductor layers, and thereafter, the second voltage is biased to odd-numbered first semiconductor layers in the M first semiconductor layers, and thereafter, the second voltage is biased to even-numbered first semiconductor layers in the M first semiconductor layers.

13. The semiconductor storage device according to claim 10, wherein the second resistivity is higher than the first resistivity.

14. The semiconductor storage device according to claim 10, wherein the first variable resistance material layer comprises a phase change material; and
the phase change material is in a crystal state at a part where the variable resistance material layer has the first resistivity, and in an amorphous state at a part where the variable resistance material layer has the second resistivity.

15. The semiconductor storage device according to claim 10, further comprising:
a third selected line extending in parallel with the second selected line;
N second semiconductor layers stacked through insulator films over the semiconductor substrate;
a second gate insulator film provided along the side surfaces of the N second semiconductor layers;
a second channel layer provided along the side in the side surfaces of the second gate insulator film layers where the second semiconductor layers are not provided, and electrically connected to the first selected line and the third selected line; and
a second variable resistance material layer provided along the side in the side surfaces, of the second channel layers where the second gate insulator film layers are not provided, electrically connected to the first selected line and the third selected line, and comprising a material that varies a resistivity by flown current,
wherein, when a resistivity of the second channel layer is compared with a resistivity of a part of the second variable resistance material layer adjacent to the second semiconductor layer, the resistivity of the second channel layer side is lower than a resistivity of the second variable resistance material layer side when a first voltage is biased to the adjacent second semiconductor layer, and the resistivity of the second channel layer side is higher than the resistivity of the second variable resistance material layer side when a second voltage is biased to the adjacent second semiconductor layer; and
at the time, of setting a resistivity of a part of the first variable resistance material layer adjacent to the N first semiconductor layers to the first resistivity, a control in which a resistivity of a part of the second variable resistance material layer adjacent to the N second semiconductor layers is set to the first resistivity is performed.

* * * * *